US011412617B2

(12) United States Patent
Petelik et al.

(10) Patent No.: US 11,412,617 B2
(45) Date of Patent: Aug. 9, 2022

(54) METHODS AND APPARATUSES FOR INTERFACING MICROWAVE CIRCUITS

(71) Applicant: The Government of the United States, as represented by the Secretary of the Navy, Washington, DC (US)

(72) Inventors: Thomas Petelik, Alexandria, VA (US); Steven Bode, Alexandria, VA (US); Matthew Anderson, Hanover, MD (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/857,129

(22) Filed: Apr. 23, 2020

(65) Prior Publication Data

US 2020/0344882 A1   Oct. 29, 2020

Related U.S. Application Data

(60) Provisional application No. 62/966,621, filed on Jan. 28, 2020, provisional application No. 62/837,464, filed on Apr. 23, 2019.

(51) Int. Cl.
*H05K 7/00* (2006.01)
*H05K 1/18* (2006.01)
*H01R 12/71* (2011.01)

(52) U.S. Cl.
CPC .......... *H05K 1/181* (2013.01); *H01R 12/716* (2013.01); *H05K 2201/10189* (2013.01)

(58) Field of Classification Search
CPC ......... H05K 1/181; H05K 2201/10189; H01R 12/716
See application file for complete search history.

(56) References Cited

U.S. PATENT DOCUMENTS

| | | | | |
|---|---|---|---|---|
| 2002/0070753 | A1* | 6/2002 | Vogel | G06F 30/34 326/37 |
| 2004/0029409 | A1* | 2/2004 | Moon | H01R 12/716 439/65 |
| 2009/0144568 | A1* | 6/2009 | Fung | G06F 1/3221 713/300 |
| 2014/0268577 | A1* | 9/2014 | Swaminathan | H05K 1/117 361/719 |
| 2016/0170928 | A1* | 6/2016 | Tamarkin | G06F 13/409 710/313 |
| 2016/0183374 | A1* | 6/2016 | Prakash | H05K 1/181 361/719 |
| 2017/0069988 | A1* | 3/2017 | Ouyang | H01R 13/71 |

(Continued)

FOREIGN PATENT DOCUMENTS

EP    3297141 A1 *  3/2018  ............. B25F 5/008

*Primary Examiner* — Andargie M Aychillhum
(74) *Attorney, Agent, or Firm* — US Naval Research Laboratory

(57) ABSTRACT

An apparatus for interfacing with an RF/microwave subsystem is provided. The apparatus includes a printed circuit board that includes: a controller, and a connector constructed to provide control signals and power signals to a subsystem in accordance with instructions from the controller, and a mechanical interface constructed to provide a mechanical connection between the subsystem and the printed circuit board.

13 Claims, 45 Drawing Sheets

(56) References Cited

U.S. PATENT DOCUMENTS

2017/0147524 A1* 5/2017 Chen .................... G06F 13/4022
2018/0062454 A1* 3/2018 Besel ...................... B60L 53/16
2018/0331081 A1* 11/2018 Goh ........................ H01L 23/48

* cited by examiner

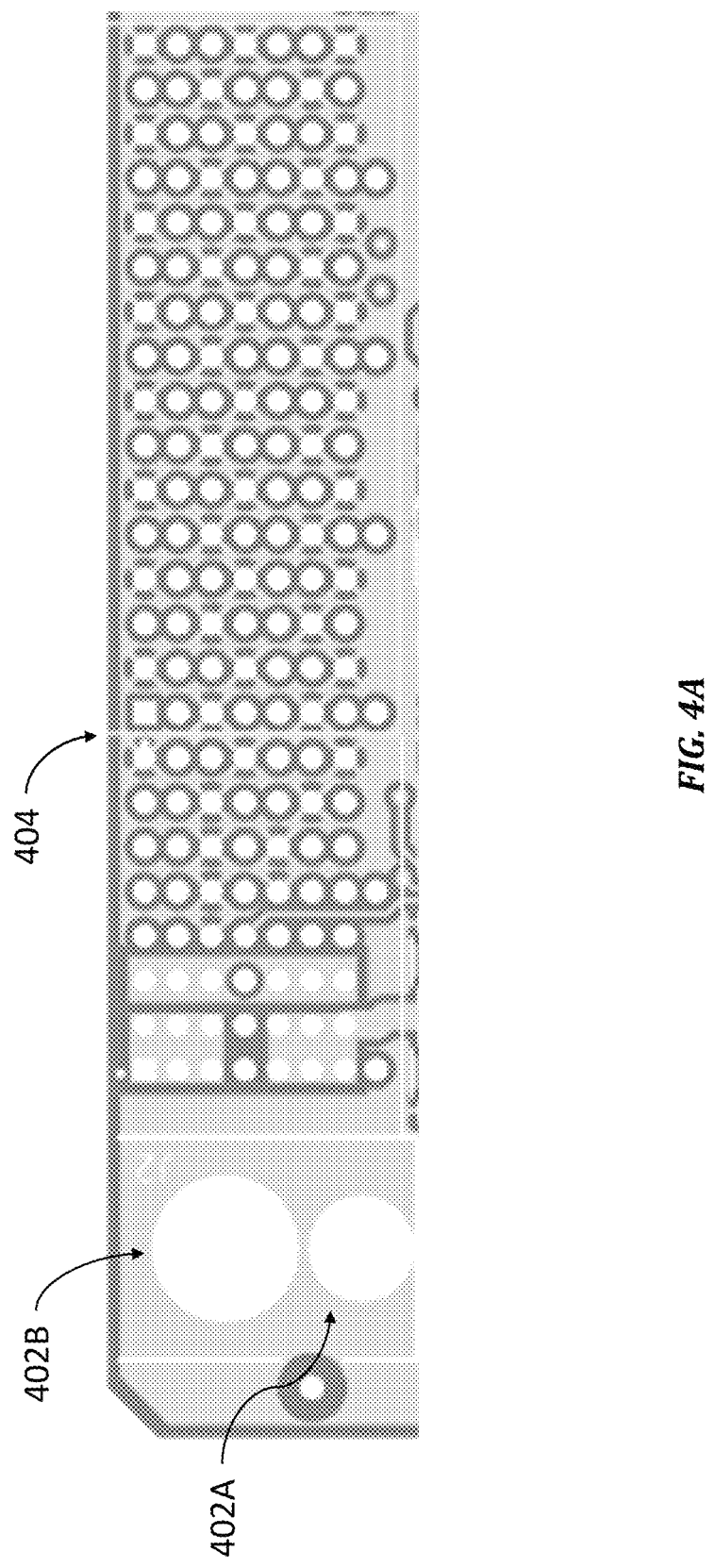

316
1102

METHODS AND APPARATUSES FOR INTERFACING MICROWAVE CIRCUITS

BACKGROUND

Field of the Invention

The present application relates generally to interfacing microwave circuits.

Description of Related Art

Radio-frequency (RF) and microwave subsystems (e.g., military/commercial radars, jammers, communications transceivers, wireless internet routers, cellular communications) require a variety of inputs to function, including: control, communications, sensing and power. In conventional RF/Microwave subsystems, a custom single-use interface is used to connect to the subsystem. The custom interface includes a package of interfacing electronics that are specially designed and intended for the subsystem. The custom interface is usually designed and constructed by a highly-skilled engineer or technician and packaged into a suitable physical enclosure. The downside of this approach is obvious: the design is not repeatable across different subsystems. If a single additional component is added to the subsystem, an entirely new interface design may have to be conceived of, constructed, tested, and implemented to return to an operating state, which is a waste of time and resources.

Another approach is to design a custom printed circuit board (PCB) that can be reconfigured to approximate contiguous PCBs. These custom PCBs include pins to feed directly from one side of the board to the other. One such interface may be for a small computer (e.g., a Raspberry Pi). However, this design leaves much to be desired. The Raspberry Pi includes an old, virtually obsolete, processor chip with limited hardware functionality and a Linux operating system that is intended for general applications. As a result, there are a limited number of inputs/outputs or hardware specific functions (e.g., UART, SPI/Chip selects, analog monitoring, analog outputs, pulse generation, etc. . . . ) which can be routed to microwave components. The combination of a slow system and limited hardware capabilities makes real-time control through the Raspberry Pi difficult, if not impossible. Moreover, custom PCBs do not provide for a multitude of connections, do not supply power to the subsystems, and lack monitoring capabilities for things like voltage irregularities. If one wishes to change a component on the subsystem it may be necessary to desolder the connection to the component that is being replaced, replace said component, and then solder a new connection, which is inefficient. Also, power is not provided to the subsystem with this approach. Still further, additional custom design (i.e., the first approach described above) is still necessary to integrate the subsystem into a larger system. For these reasons, it would be beneficial to provide an interface that could be quickly reconfigured based on a change to a subsystem, would provide power to the subsystem, and can be integrated into a larger system.

SUMMARY OF THE INVENTION

One or more the above limitations may be diminished by structures and methods described herein.

In one embodiment, an apparatus for interfacing with a subsystem, is provided. The apparatus includes a printed circuit board that includes: a controller, and a connector constructed to provide control signals and power signals to a subsystem in accordance with instructions from the controller, and a mechanical interface constructed to provide a mechanical connection between the subsystem and the printed circuit board.

BRIEF DESCRIPTION OF THE DRAWINGS

The teachings claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 4A is a plan view of section 302 of PCB 200 according to one embodiment;

Figure 1A:
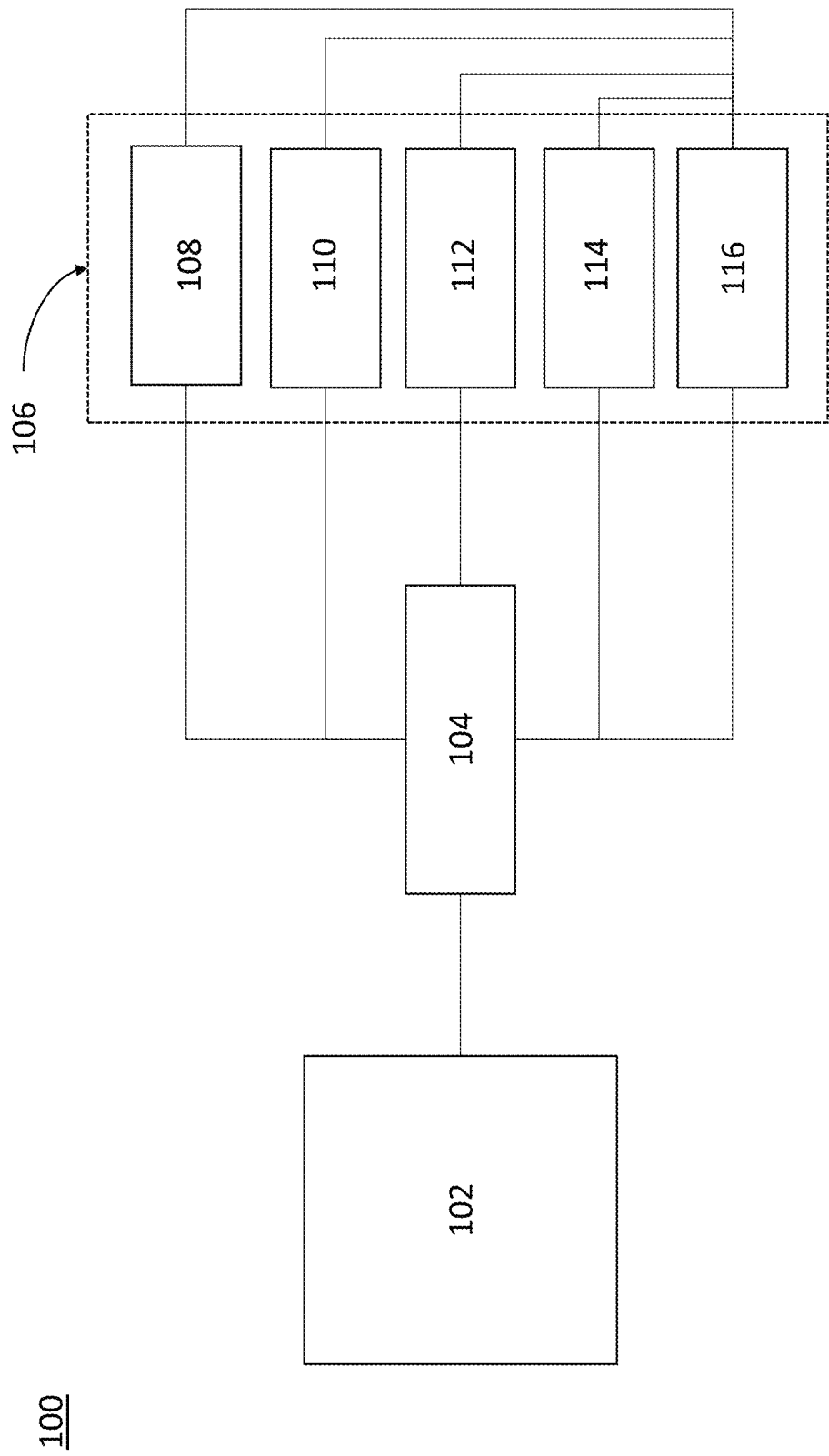
FIG. 1A is a schematic view of an interface, according to one embodiment, connected to an RF/microwave subsystem and another device.

Different ones of the Figures may have at least some reference numerals that are the same in order to identify the same components, although a detailed description of each such component may not be provided below with respect to each Figure.

DETAILED DESCRIPTION OF THE PREFERRED EMBODIMENTS

In accordance with example aspects described herein are methods and apparatuses for interfacing microwave circuits.

FIG. 1A is a schematic view of a system 100 that includes a subsystem 102, an interface 104, a communication and control input/output 108, a signal input/output 110, a mechanical interface 112, a power input 114, and a laboratory equipment connection 116. Some or all of 108-116 may be part of another system 106. Subsystem 102 may be a radiofrequency (RF) subsystem or a microwave subsystem with communication, control and power requirements that are unique to that subsystem. Subsystem 102 is mechanically and electrically connected to interface 104, which is described in detail below. Interface 104 may also be mechanically connected to the other system 106 through, in part, its mechanical interface 112. Interface 104 may also be electrically/communicatively connected to one or more of the communication and control input/output 108, the signal input/output 110, the power input 114, and the laboratory equipment connection 116. For example, if system 106 is a control system for larger microwave system that relies upon subsystem 102 to perform certain operations, then the system designer can connect the communication and control input 108 to interface 104 to provide control signals through interface 104 to subsystem 102 to cause subsystem 102 to perform the required operations. If those operations require subsystem 102 to receive a signal, then the system designer can connect the signal input/output 110 to interface 104 to provide the requisite signals to subsystem 102. If subsystem 102 requires power to operate, then the system designer can connect the power input 114 to interface 104 which in turn provides power to subsystem 102. One advantage of this arrangement, over the conventional approaches described above, is that communication, control, and power connections between subsystem 102 and the other system 106 may all be established through interface 104. Of course, as one of ordinary skill will appreciate, interface 104 could be connected to more than one other system or device by virtue of the multiple input/output devices that can be incorporated into interface 104. Moreover, as described in detail below, when a change is made to subsystem 102 it is not always necessary to modify interface 104 in response to that change.

Figure 1B:
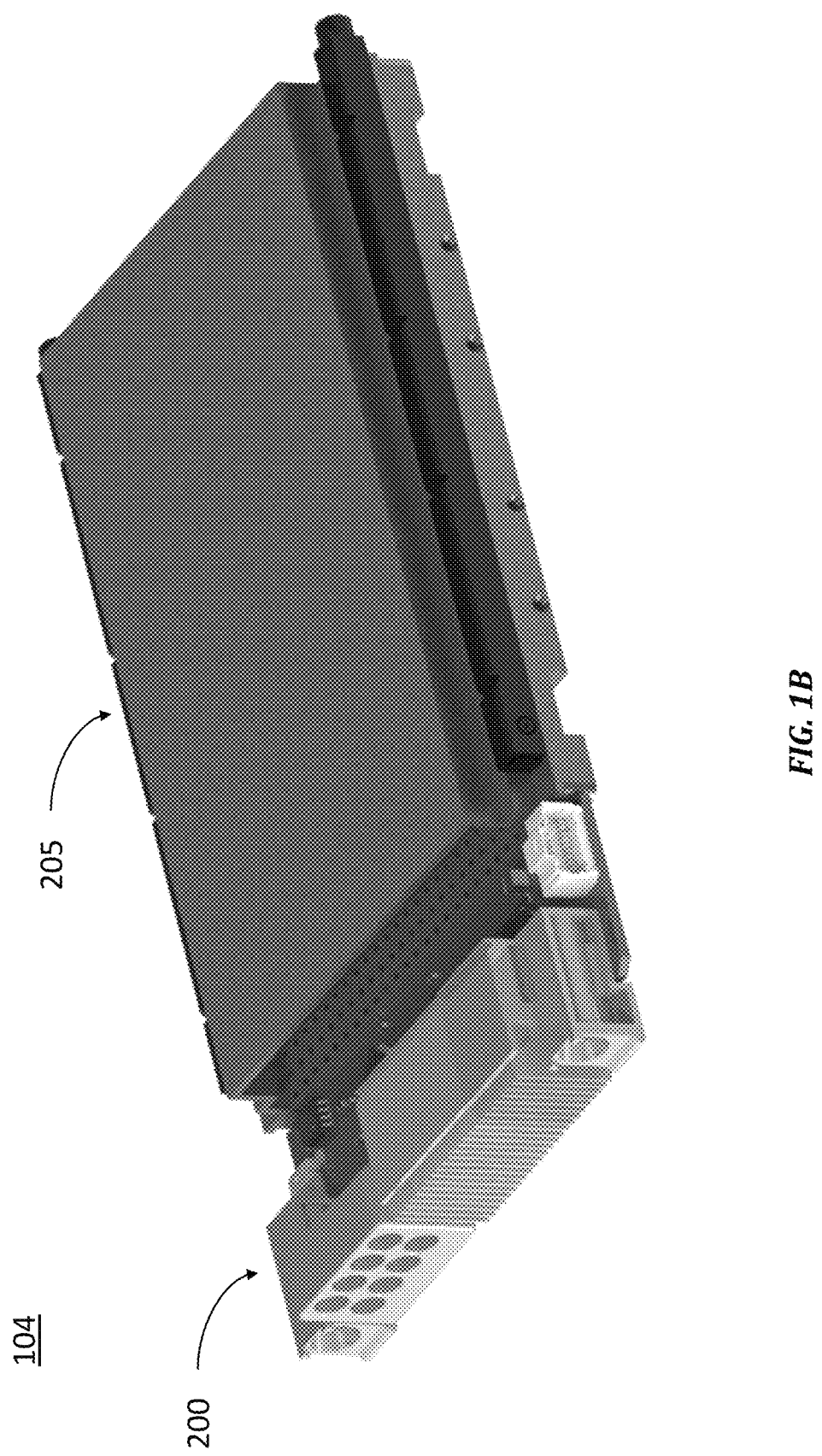
FIG. 1B is a perspective view of an interface according to one embodiment that includes a printed circuit board (PCB) and a mechanical interface.

FIG. 1B is a perspective view of interface 104 according to one embodiment. Interface 104 comprises two main components: a printed circuit board (PCB) 200 that includes a plurality of components attached thereto and a mechanical interface 205 that includes a plurality of components for effecting a mechanical connection with subsystem 102. Each of these components will be discussed in detail below beginning with the PCB 200.

Figure 2A:
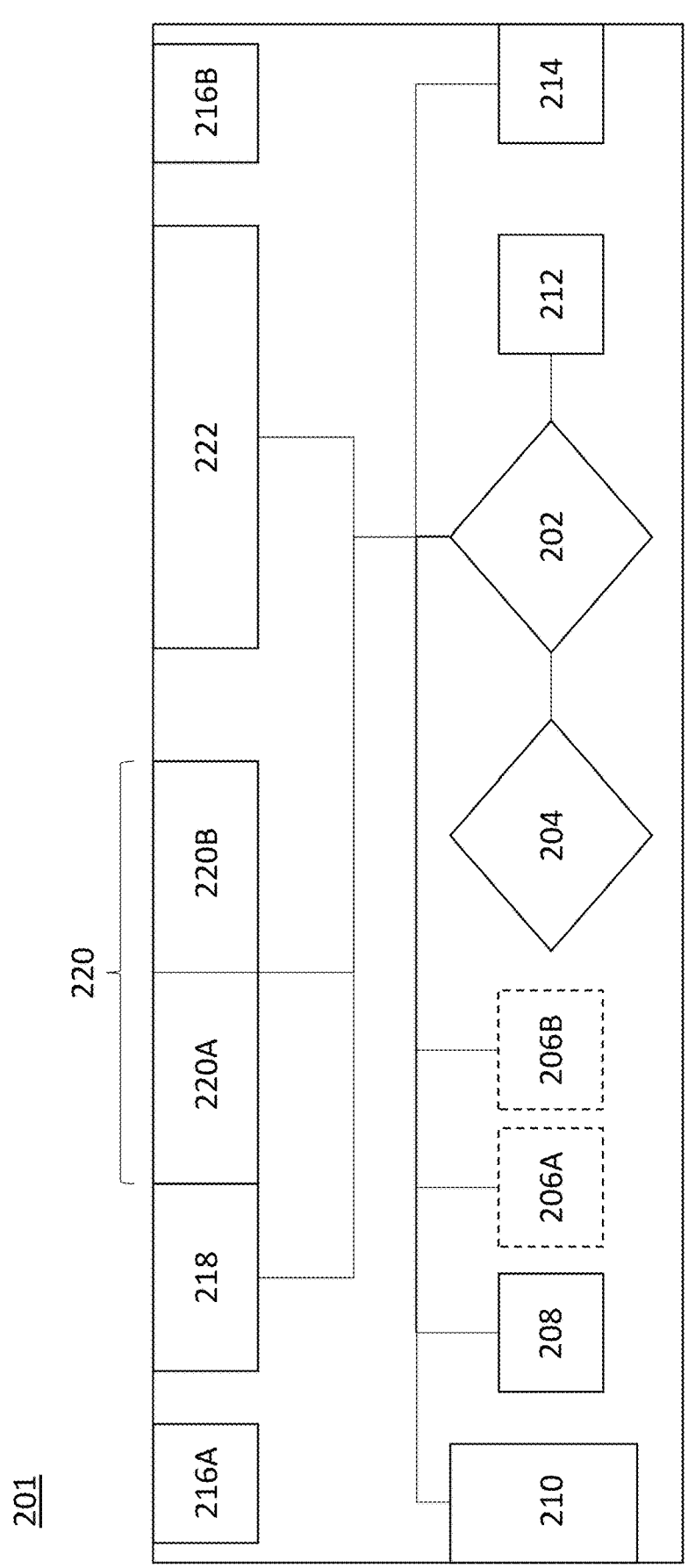
FIG. 2A is a schematic illustration of a first side 201 of PCB 200 according to one embodiment.

PCB 200 includes a first side 201 and a second side 203. FIG. 2A is a schematic view of the first side 201 of PCB 200. Overall control of the components on PCB 200 is provided by a controller 202, also referred to as a main control unit (MCU). Controller 202 may be a central processing unit (CPU), microcontroller, or a microprocessor. Communicatively connected to controller 202 is memory 212 that stores a control program (e.g., firmware) that, when executed by controller 202, provides for overall control of the components connected to PCB 200 in accordance with signals and instructions received by controller 202. Memory 212 may also serve as a storage location for data received from system 106 or subsystem 102. Also communicatively connected to controller 202 is a complex programmable logic device (CPLD) 204. CPLD 204 is a programmable logic device that serves two main functions. First, it is a firmware reconfigurable interconnect between the RF connector digital interface pins of connectors 224A-D. In an exemplary embodiment, pins 3, 4, 11, 12, 13, and 14 of connectors 224A-D are the digital input/output pins and are reconfigurable interconnect pins. Pins 3, 4, 11, and 12 are connected to both controller 202 (where they are fixed function) and CPLD 204 (where they can have a firmware configurable function, which includes being left disconnected) Pins 13 and 14 are only connected to the CPLD 204. Second, CPLD 204 provides a low latency, high clock rate, programmable digital logic interface with triggers and internal registers for end user flexibility to implement techniques which may not be possible using fixed logic and hardware connections implemented by controller 202.

While controller 202 is capable of receiving and processing signals from subsystem 102 or another system 106, due to the manner in which controller 202 is constructed, it may, in some situations, take too long or not be capable of processing those signals and providing responsive instructions in return. Thus, CPLD 204 may be configured with internal triggers and registers that allow CPLD 204 to quickly process a received signal and provide a responsive instruction. The internal triggers may implemented by internal logic gates which may be reconfigured via a firmware instruction from controller 202. As one of ordinary skill will appreciate, registers are small amounts of very high speed memory that temporarily store received information (e.g., a signal from subsystem 106) and provides the same to the logic gates for processing at the appropriate time. In an exemplary embodiment, a receives trigger from LVDS 206A may be connected only to CPLD 204 which allows for the lowest possible latency. CPLD 204 may receive a trigger signal directly LVDS 206A. The receives trigger may have a firmware configurable function (e.g., flip a latch, set a group of switch positions, raise an interrupt in controller 202, etc."). A power regulator 208 is also provided. Power regulator 208 is constructed to provide a high current supply for VRF (+6.5V). In an exemplary embodiment, that voltage may be provided to subsystem 102 through pins 1 and 9 of connectors 224A-D from the +12V rail of an external power supply. The −6.5V is provided by linear regulator 602 from the −12V rail of an external power supply through pins 2 and 10 of connectors 224A-D, and is much lower current since the negative supply is used, generally, only for bias. Power regulator 208 and linear regulator 602 are both communicatively connected to controller 202. Controller 202 is configured to enable or disable both power regulator 208 and linear regulator 602 and monitor a power status pin embedded in PCB 200 to determine if regulators 208 and 602 are operating properly.

The first side 201 of PCB 200 also includes several components that allow for connections to devices, subsystems, and other systems. A USB interface 214 is provided on the first side 201 of the PCB 200. USB interface 214 is communicatively connected to controller 202 and provides a connection between PCB 200 and the external system 106. Through USB interface 214, controller 202 may send and receive instructions, data, and other information with external device or system 106 and may also receive 5V power. As discussed above, controller 202 is connected to LVDS 206A. However, in an alternative embodiment an RS-485 206B may be provided in lieu of LVDS 206A. As one of ordinary skill will appreciate, LVDS stands for low-voltage differential signaling in which low voltage swings are used to transmit data at high rates. In one embodiment, when VPX compliant communications are provided, LVDS 206A is included to support such communications. However, LVDS 206A can also be used through the multi-pin remote interface 210. LVDS 206A may be configured to receive information through multi-pin remote interface (MPRI) 210; specifically through 2 pairs of pins labeled "Trig1_P", "Trig1_N", "Trig2_P", and "Trig2_N", as shown in FIG. 6C. If the LVDS 206A isn't provided, then an RS-485 206B is provided in its place. As one of ordinary skill will appreciate, RS-485 is a serial communications protocol which provides yet another communication pathway between interface 104 and a system 106. Interface 104 may therefore be supplied with some or all of the following communication pathways: USB 214, LVDS 206A, RS-485 206B, the P0 connector 218, the P1A connector 220A, the P1B connector 220B, and 3U VPX VITA 67.2 connector 222. Controller 202 may be constructed to receive instructions from system 106 through one or more of these communication pathways. Thus, if one of these communication pathways were temporarily unavailable, communications between interface 104 and system 106 (and by extension subsystem 102) could be established through another pathway.

Differential signals received by interface 104 are routed to either LVDS 206A or RS-485 206B. Then, the single ended signal to/from this transceiver (206A or 206B) is routed to the CPLD 204 and/or controller 202. Controller 202 is constructed to use internal hardware functions to implement a USART at variable bit rate for digital communications. There is also a single ended signal from controller 202 and CPLD 204 to either LVDS 206A or RS-485 206B (depending upon the embodiment) which enables the output line driver. The line driver enable is coordinated by hardware and software on controller 202 to allow for multi-host simultaneous communication on the serial bus.

Returning to FIG. 2A, a multi-pin remote interface 210 is also provided and connected to controller 202. Turning to the top of the front side 201 of PCB 200, a 3U VPX connection may also be provided, in an exemplary embodiment, in the form of P0 connectors 218, P1A connectors 220A, P1B connectors 220B, and 3U VPX VITA 67.2 connector 222. The P0 connectors 218 provide power and "system management bus" (OpenVPX defined "SM0" or "SM1") to a connected system 106. The P1A connectors 220A and P1B connectors provide communication and control capabilities between system 106 and interface 104. The SM0 bus is connected to controller 202 and can communicate on this bus like any other OpenVPX device. The GA (address) pins are also all connected. The 3U VPX VITA 67.2 connector 222 acts as a RF/Microwave connector allowing RF/microwave signals to get to and from subsystem 102 to interface 104 to a VPX compliant system 106, in the case system 106 is a VPX compliant system. Connector 222 allows subsystem 102 to interface with a larger system (e.g., system 106) in which subsystem 102 is installed. Also provided are female/male keyguides receptacles 216A and 216B that ensure connectors are aligned when they are inserted. Having identified and described components on the first side 201 of PCB 200, attention will now be directed to the components on the second side 203 of PCB 200 with reference to FIG. 2B.

Figure 2B:
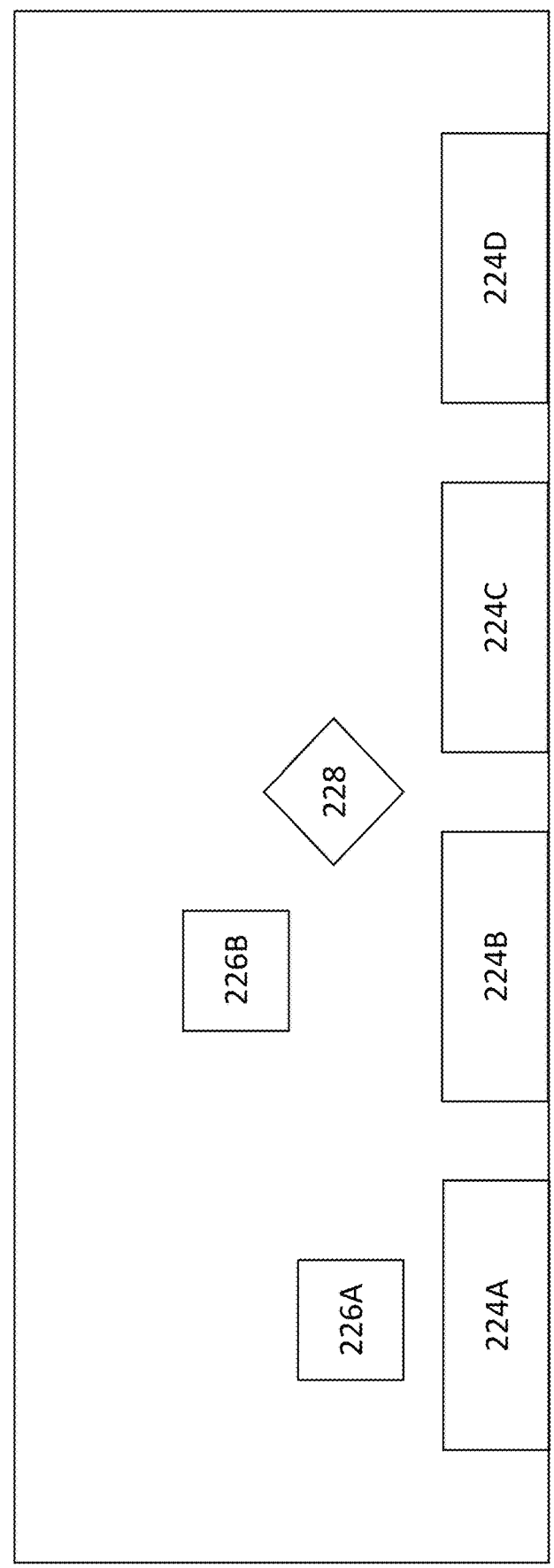
FIG. 2B is a schematic illustration of a second side 203 of PCB 200 according to one embodiment.

As shown in FIG. 2B, a plurality of bottom connectors 224A-D are provided on the second side 203. In an exemplary embodiment, connectors 224A-D are 14 pin connectors that enable removal of microwave bias/control boards with the need to solder/desolder the same. Connectors 224A-D are connected to controller 202 such that power, control, sensors, and communication signals may be exchanged between controller 202 and subsystem 102 components connected to connectors 224A-D. Table 1 below shows the functions of each of the pinouts of connectors 224A-D:

TABLE 1

| | | | Pinouts for Connectors 224A-D | |
|---|---|---|---|---|
| Pin | Net | IO Type | Notes/Controller 202 Alt Function | Carrier Board Connection |
| | | | 224A | |
| 1 | VRF | Power | | "PWR IN" |
| 2 | NVRF | Power | | "-VIN" |
| 3 | RF1_D0 | MCU 3.3 V | TIM2_CH1 | |
| 4 | RF1_D1 | MCU 3.3 V | | |
| 5 | MOSI | SPI | | |
| 6 | MISO | SPI | | |
| 7 | SCLK | SPI | | |
| 8 | RF1_AN0 | Analog In | ADC_IN2/COMP2_INM | |
| 9 | VRF | Power | | |
| 10 | NVRF | Power | | |
| 11 | RF2_D0 | MCU 3.3 V | ADC_IN14 | |
| 12 | RF2_D1 | MCU 3.3 V | ADC_IN9 | CTL* |
| 13 | L0 | CPLD 3.3 V | | CTL* |
| 14 | L1 | CPLD 3.3 V | | |
| | | | 224B | |
| 1 | VRF | Power | | "PWR IN" |
| 2 | NVRF | Power | | |
| 3 | RF3_D0 | MCU 3.3 V | | |
| 4 | RF3_D1 | MCU 3.3 V | | |
| 5 | MOSI | SPI | | |
| 6 | MISO | SPI | | |
| 7 | SCLK | SPI | | |
| 8 | RF3_AN0 | Analog In | ADC_IN1/COMP1_INP | "VOUT" ("VCC"; Cut pad) |
| 9 | VRF | Power | | |
| 10 | NVRF | Power | | |
| 11 | RF4_D0 | MCU 3.3 V | ADC_IN15 | |
| 12 | RF4_D1 | MCU 3.3 V | ADC_IN5/DAC_OUT2/TIM2_CH1 | |
| 13 | L2 | CPLD 3.3 V | | |
| 14 | L3 | CPLD 3.3 V | | |
| | | | 224C | |
| 1 | VRF | Power | | "PWR IN" |
| 2 | NVRF | Power | | |
| 3 | RF5_D0 | MCU 3.3 V | I2C1_SCL | |
| 4 | RF5_D1 | MCU 3.3 V | I2C1_SDA/TIM2_CH3 | |
| 5 | MOSI | SPI | | |
| 6 | MISO | SPI | | |
| 7 | SCLK | SPI | | |
| 8 | RF5_AN0 | Analog In | ADC_IN0/COMP1_INM | "VOUT" ("VCC"; Cut pad) |
| 9 | VRF | Power | | |
| 10 | NVRF | Power | | |
| 11 | RF6_D0 | MCU 3.3 V | | |
| 12 | RF6_D1 | MCU 3.3 V | | |
| 13 | L4 | CPLD 3.3 V | | |
| 14 | L5 | CPLD 3.3 V | | |
| | | | 224D | |
| 1 | VRF | Power | | "6-10 V IN" |
| 2 | NVRF | Power | | |
| 3 | RF7_D0 | MCU 3.3 V | | LE |

TABLE 1-continued

Pinouts for Connectors 224A-D

| Pin | Net | IO Type | Notes/Controller 202 Alt Function | Carrier Board Connection |
|---|---|---|---|---|
| 4 | RF7_D1 | MCU 3.3 V | | CE |
| 5 | MOSI | SPI | | DATA |
| 6 | MISO | SPI | | |
| 7 | SCLK | SPI | | CLK |
| 8 | RF7_AN0 | Analog In | ADC_IN3/COMP2_INP | |
| 9 | VRF | Power | | |
| 10 | NVRF | Power | | "-VIN" |
| 11 | RF8_D0 | MCU 3.3 V | | |
| 12 | RF8_D1 | MCU 3.3 V | | |
| 13 | L6 | CPLD 3.3 V | | CTL |
| 14 | L7 | CPLD 3.3 V | | |

Also provided are power outputs 226A and 226B that may, in an exemplary embodiment, be +12 V outputs. Power output 226A and 22B may serve an additional power outputs for subsystem 102 when such additional power output is required. Finally, a digital-to-analog (D/A) converter 228 is also provided. D/A converter 228 is also connected to controller 202 on the front side 201 of PCB 200. D/A converter 228 is constructed to convert a digital signal to analog signal, which may be provided to a subsystem 102 component. An analog-to-digital converter (not shown) may also be provided on PCB 200 (connected to controller 202) and operate to sample an analog signal received from subsystem 102 and provide the corresponding digital signal to controller 202. Having identified certain components on PCB 200, a more detailed examination of the first side 201 and second side 203 of the PCB 200 according to an exemplary embodiment will be discussed in references to FIGS. 3A-11B. While specific components are mentioned in the exemplary embodiment described below, one of ordinary skill will recognize that the particular choice of these parts is merely exemplary. One of ordinary skill will recognize that similar parts by other manufacturers could be used to replace one of the specific parts listed below. One of ordinary skill will also appreciate that some of the components identified below may provide redundant capabilities and thus may be removed to lower the production cost of interface 104.

Figure 3A:
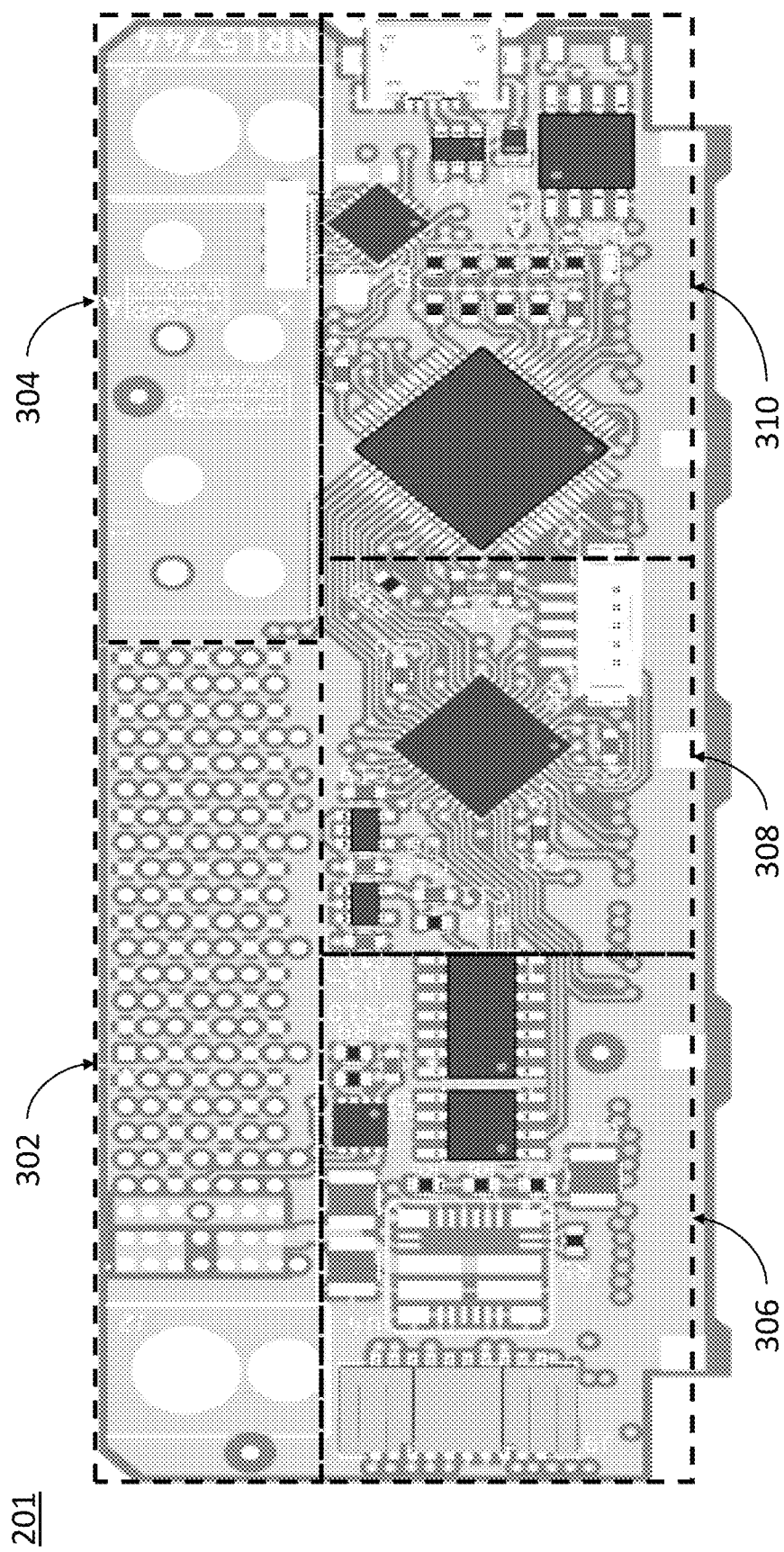
FIG. 3A is plan view of a first side 201 of PCB 200 according to one embodiment.
Figure 3B:
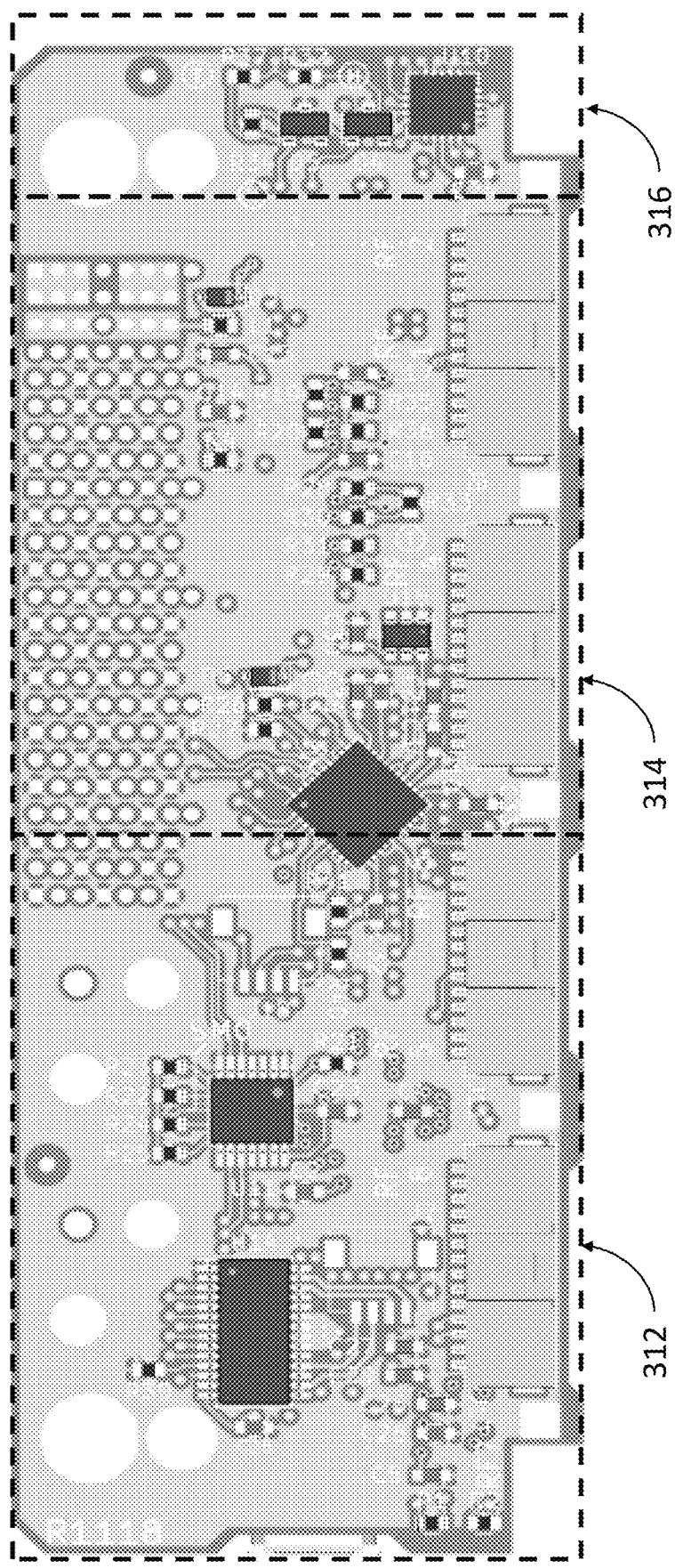
FIG. 3B is a plan view of a second side 203 of PCB 200 according to one embodiment.

FIG. 3A is a plan view of a first side 201 of the PCB 200 according to an exemplary embodiment. FIG. 3B is a plan view of the second side 203 of the PCB 200 according to the exemplary embodiment. For ease of discussion and illustration, the first side 201 is divided into a plurality of sections 302, 304, 306, 308 and 310, and the second side 203 is divided into a plurality of sections 312, 314, and 316, each of which will be discussed in detail below. Please note, however, this sectioning is merely for convenience of explanation and is arbitrarily drawn. Also, as one of ordinary skill will recognize, elements shown in FIGS. 3A and 3B that begin with an "R" are resistors, "C" are capacitors, "D" are diodes, "J" are connectors, and "U" are devices.

Figure 4B:
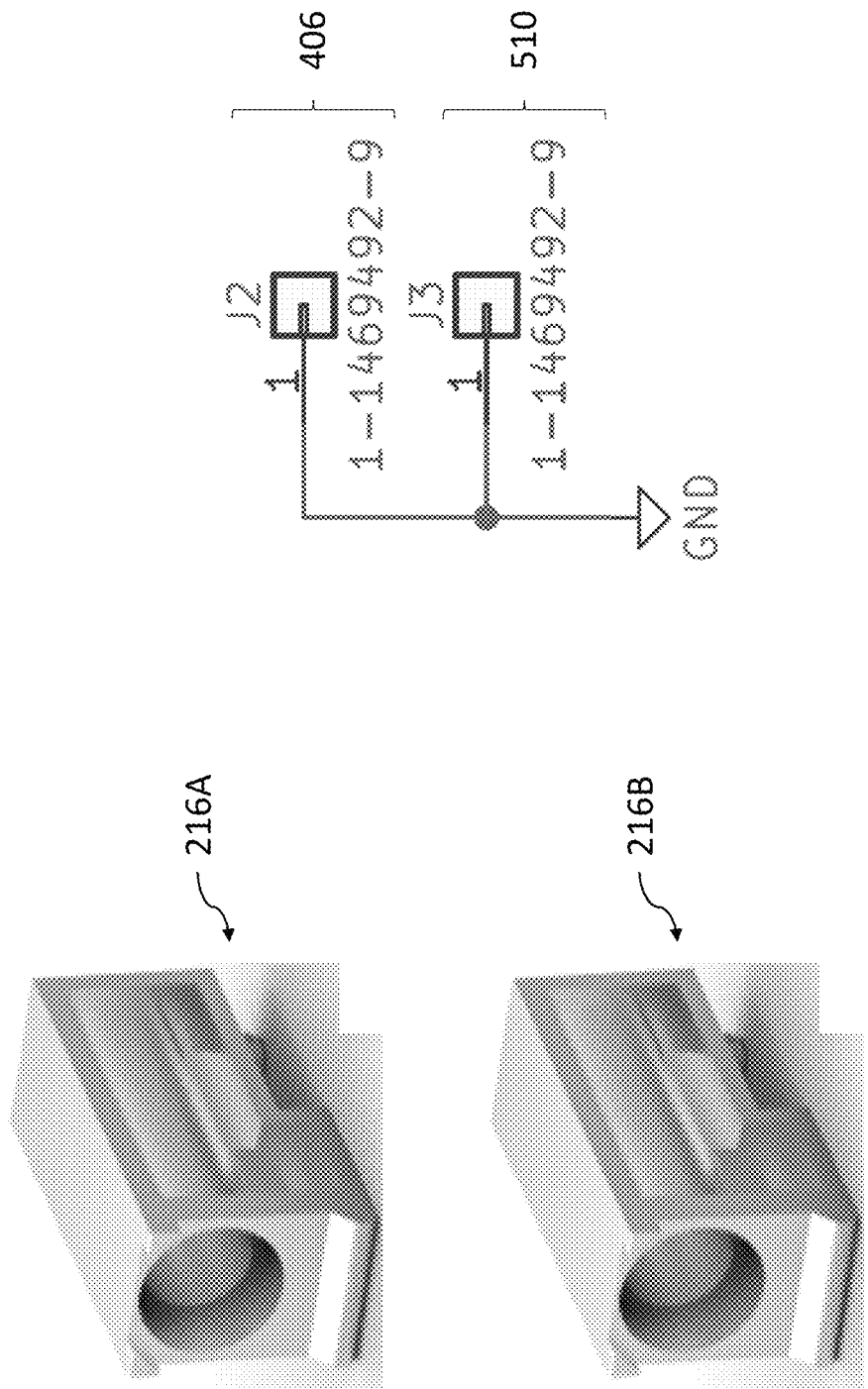
FIG. 4B illustrates keyguides 216A and 216B which are in an exemplary interface embodiment and their electrical connections.
Figure 4C:
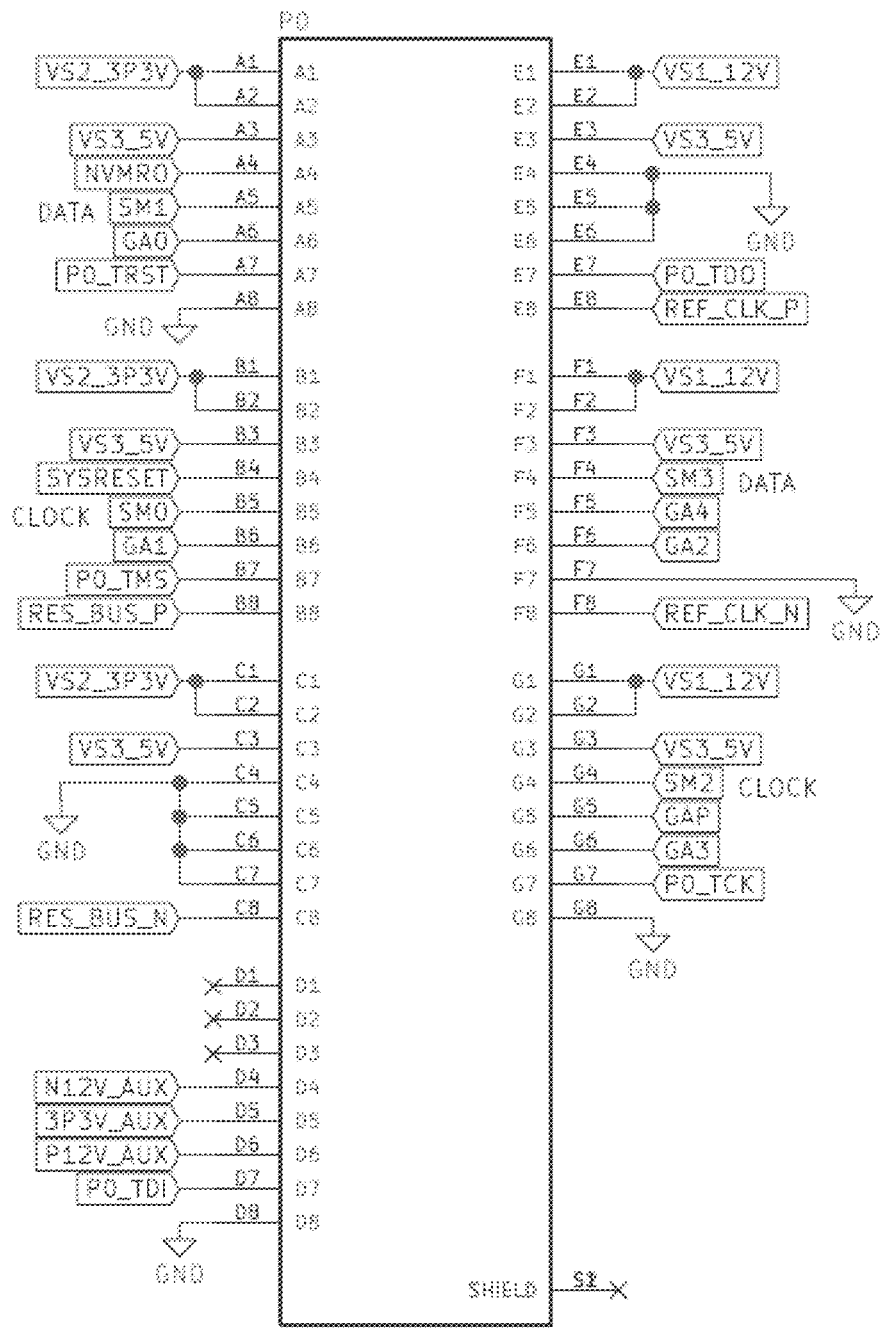
FIG. 4C is a circuit diagram illustrating the connections to connector 218 according to one embodiment.
Figure 4D:
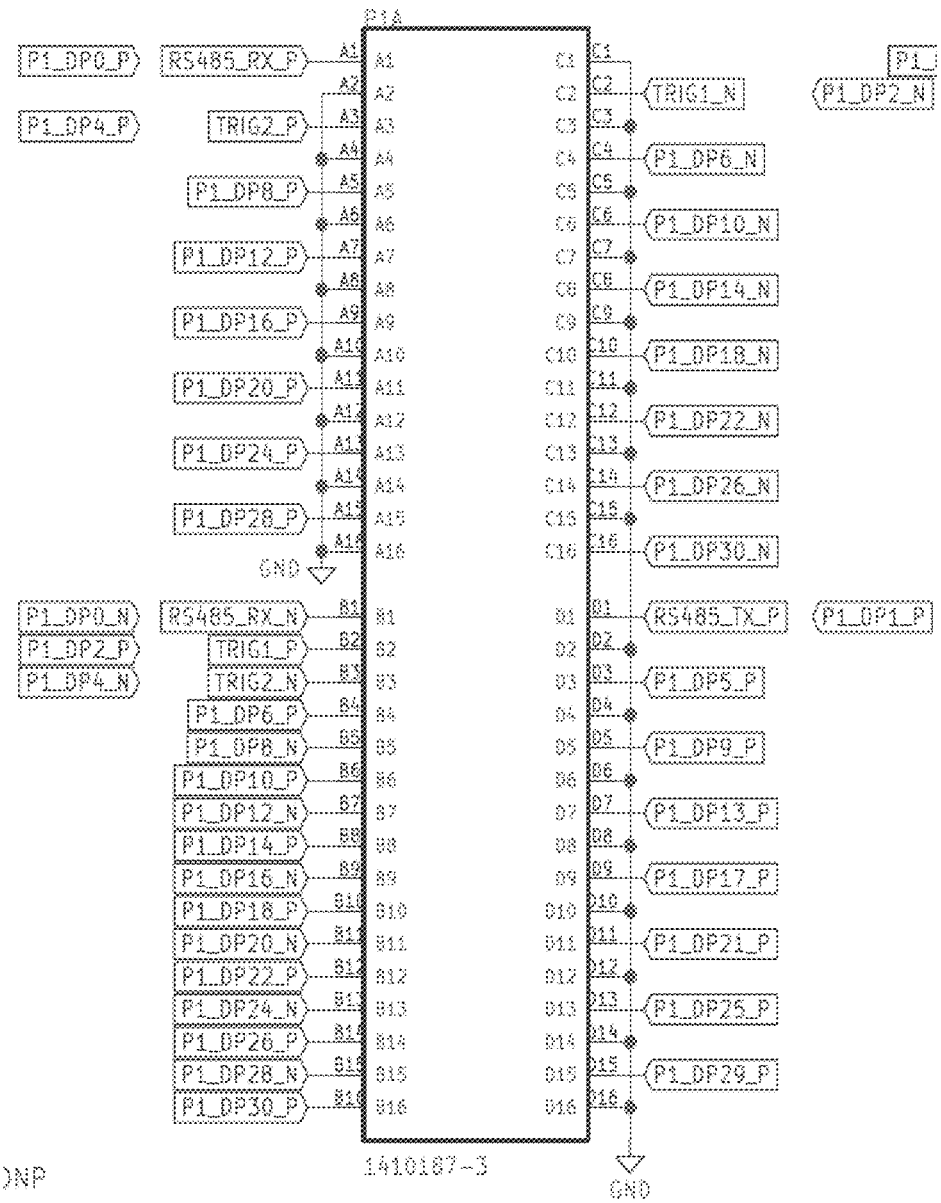
FIG. 4D is a circuit diagram illustrating the connections to connector 220A according to one embodiment.
Figure 4E:
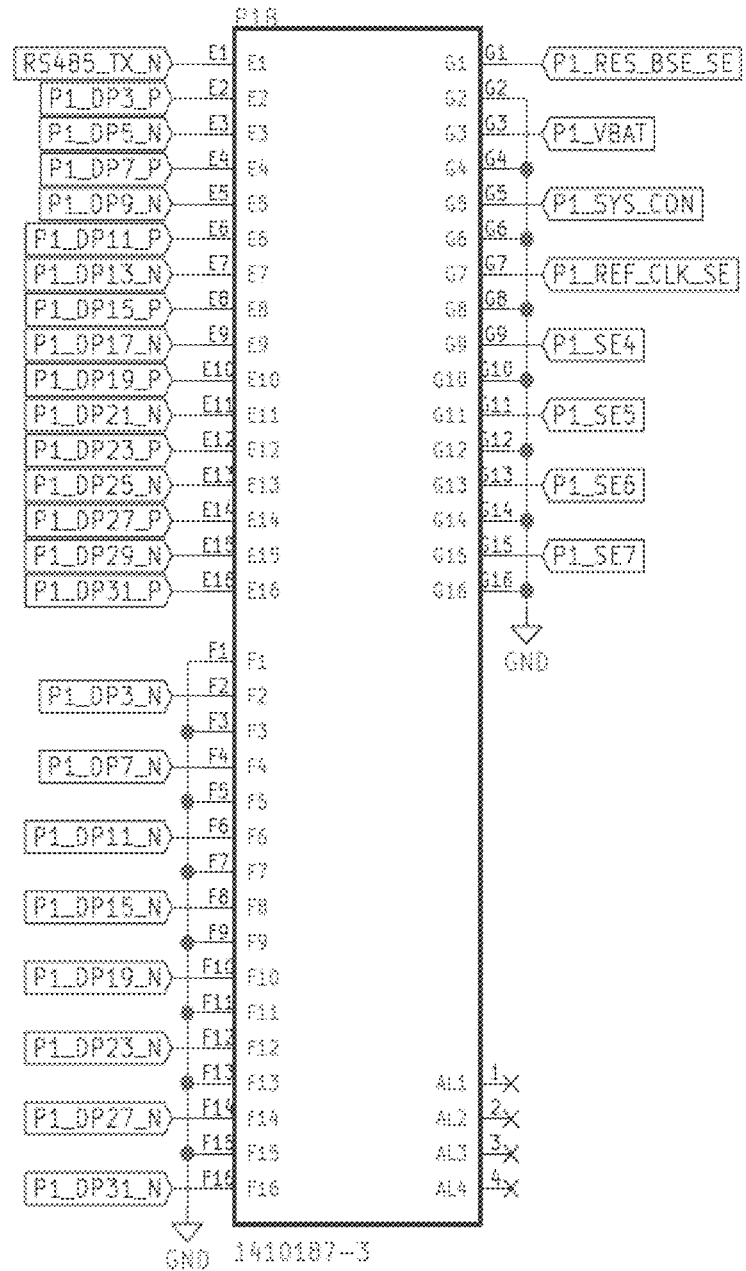
FIG. 4E is a circuit diagram illustrating the connections to connector 220B according to one embodiment.

FIG. 4A is plan view of section 302 which is located in the top left of FIG. 3A. Section 302 includes a plurality of holes 402A and 402B which allow for a physical connection of keyguide 216A to the PCB 200. Keyguide 216A is illustrated in FIG. 4B, along with an electrical diagram 406 showing how keyguide 216A is electrically connected. In the exemplary embodiment, keyguide 216A may be a MULTIGIG RT guide socket module, part number 1-1469492-9, manufactured by TE connectivity. Section 302 also includes a plurality of holes 404 that allow for the P0 connector 218, P1A connector 220A, and P1B connector 220B to be physically connected to the PCB 200 by inserting their respective pins into the plurality of holes 404 and soldering the same to make the physical connection. P0 connector 218, P1A connector 220A, and P1B connector 220B may be provided as a single unit. An exemplary single unit may be the MULTIGIG RT 2 high speed backplane connectors by TE connectivity, parts 1410189-3 (P0 connector 218) and 1410187-3 (P1A connector 220A and P1B connector 220). FIG. 4C is pin diagram for P0 connector 218, when implemented by part 1410189-3, and illustrates the respective functions of its pins. FIG. 4D is a pin diagram for P1A connector 220A, when implemented by part 141087-3, and likewise illustrates the respective functions of its pins. Finally, FIG. 4E is a pin diagram for P1B connector 220, when implemented by part 141087-3, and likewise illustrates the respective functions of its pins. Having described the components in section 302 of FIG. 3A, attention will now be directed to section 304.

Figure 5A:
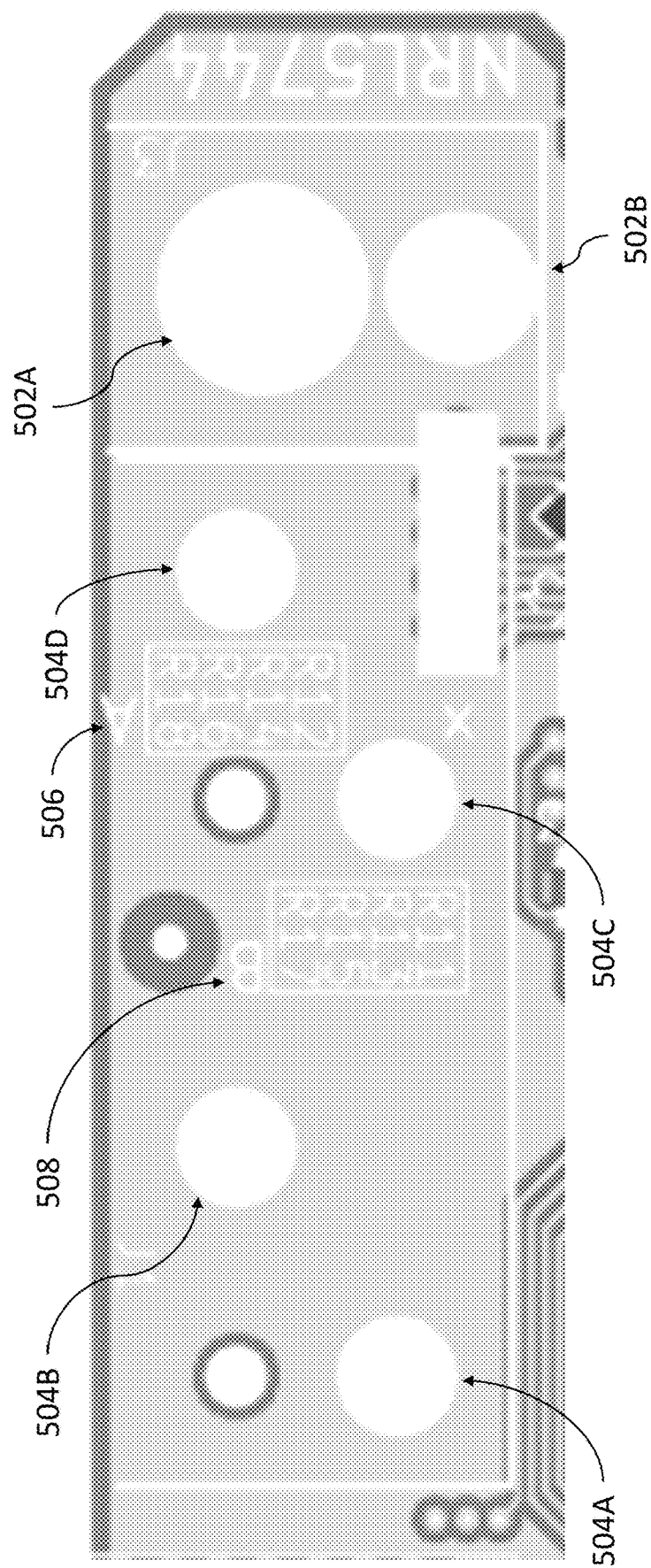
FIG. 5A is a plan view of section 304 of PCB 200 according to one embodiment.
Figure 5B:
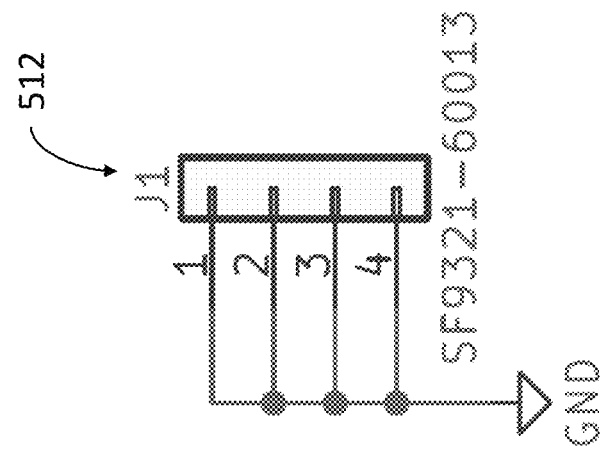
FIG. 5B is a perspective view of a connector 512 and a corresponding circuit diagram according to one embodiment.
Figure 5B:
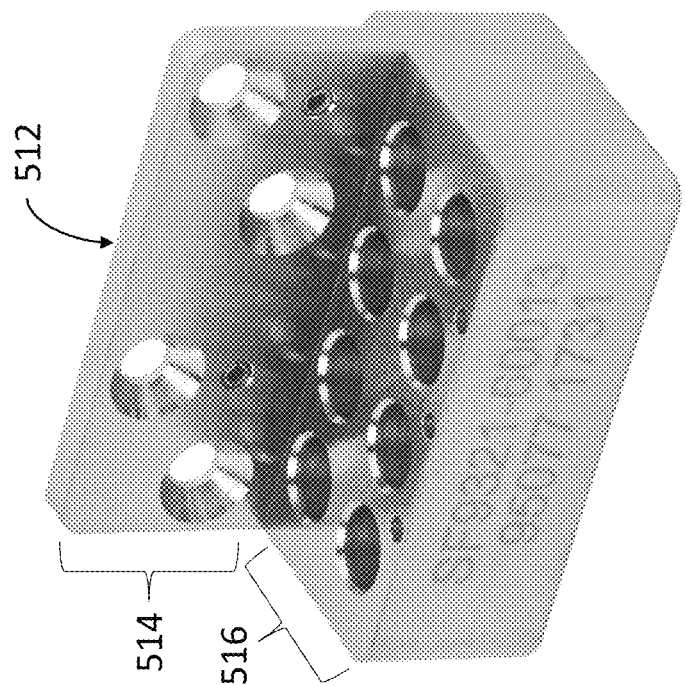

FIG. 5A is a plan view of section 304 which is located in the top right of FIG. 3A. Section 304 includes a plurality of holes 502A and 502B that allow for a physical connection of keyguide 216B (shown in FIG. 4B) to PCB 200. FIG. 4B also shows the electrical diagram 510 for keyguide 216B. Section 304 also includes another plurality of holes 504A-D that allow for a physical connection of 3U VPX VITA 67.2 connector 222 to PCB 200. FIG. 5B shows an exemplary structure 512 for 3U VPX VITA 67.2 connector 222 when such a connector is implemented by Amphenol SV Microwave part number SF9321-60013; FIG. 5B also shows an electrical diagram for connector 222 when implemented by that part. Finally, FIG. 5A also identifies two groups of resistors: Group A 410 comprising R12-18 and Group B 412, comprising R11-R17. These resistors not located in section 304, but rather are located elsewhere on PCB 200 but are simply identified in section 304. Having described the components in section 304, attention will now be directed to section 306.

Figure 6A:
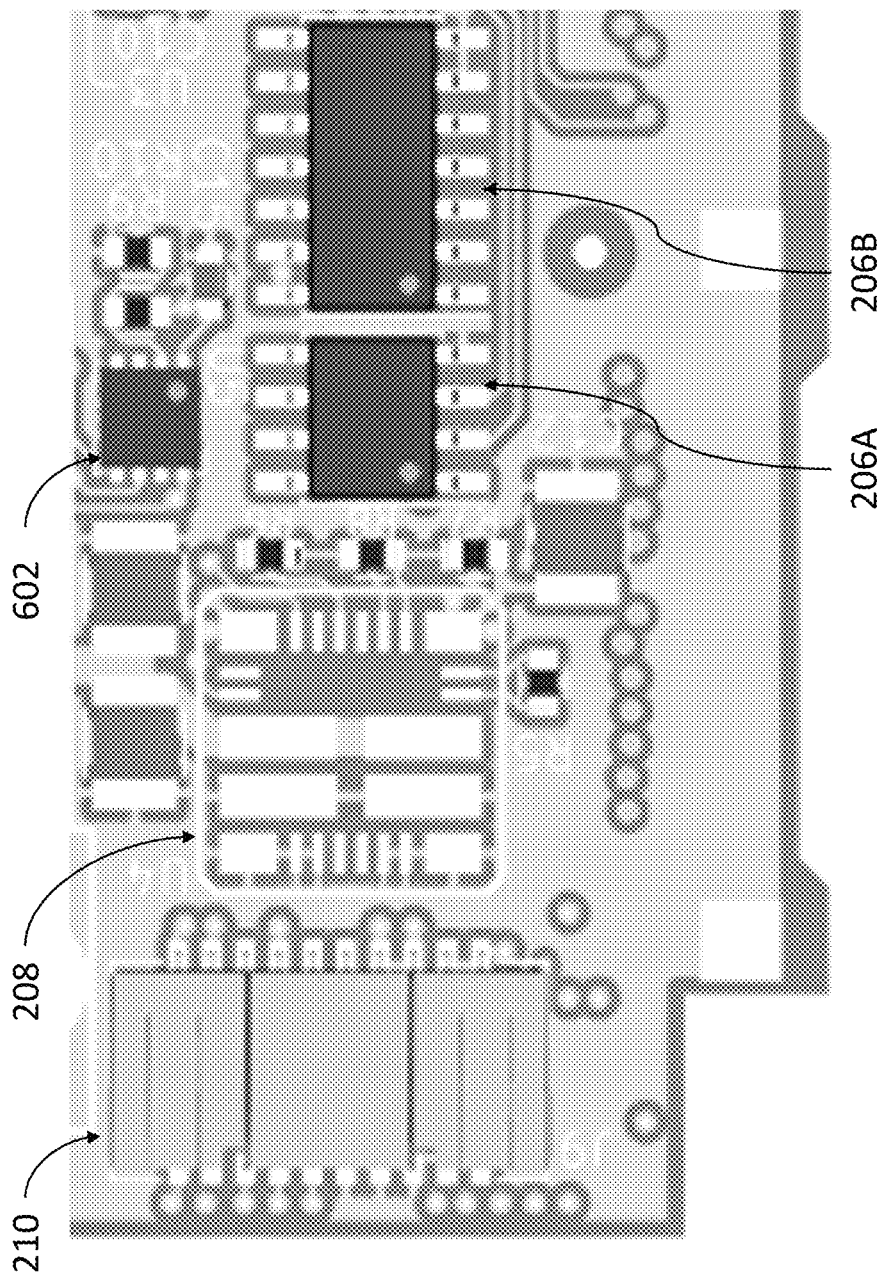
FIG. 6A is a plan view of section 306 of PCB 200 according to one embodiment.
Figure 6B:
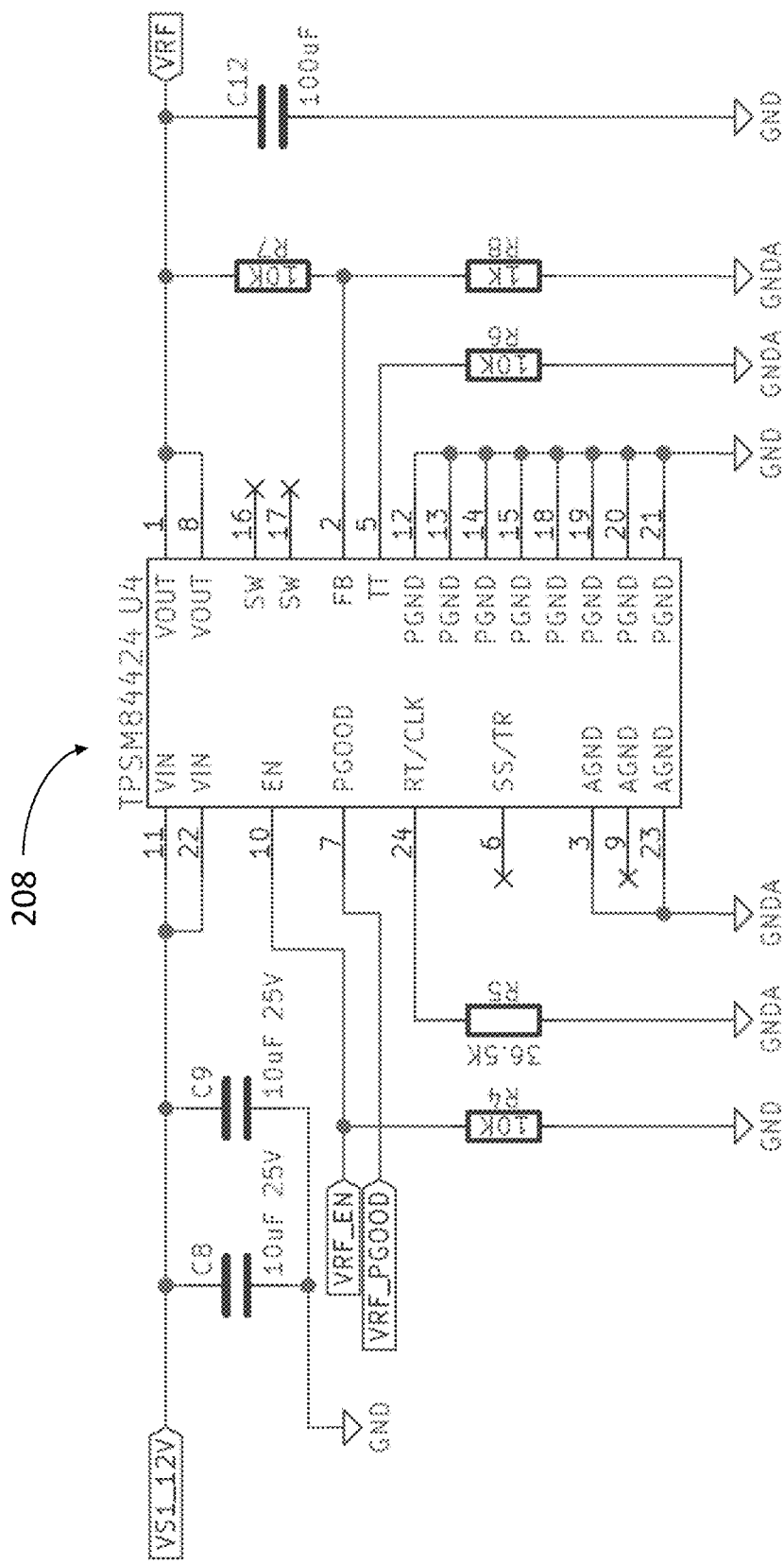
FIG. 6B is a circuit diagram showing the connections to power module 208 according to one embodiment.
Figure 6C:
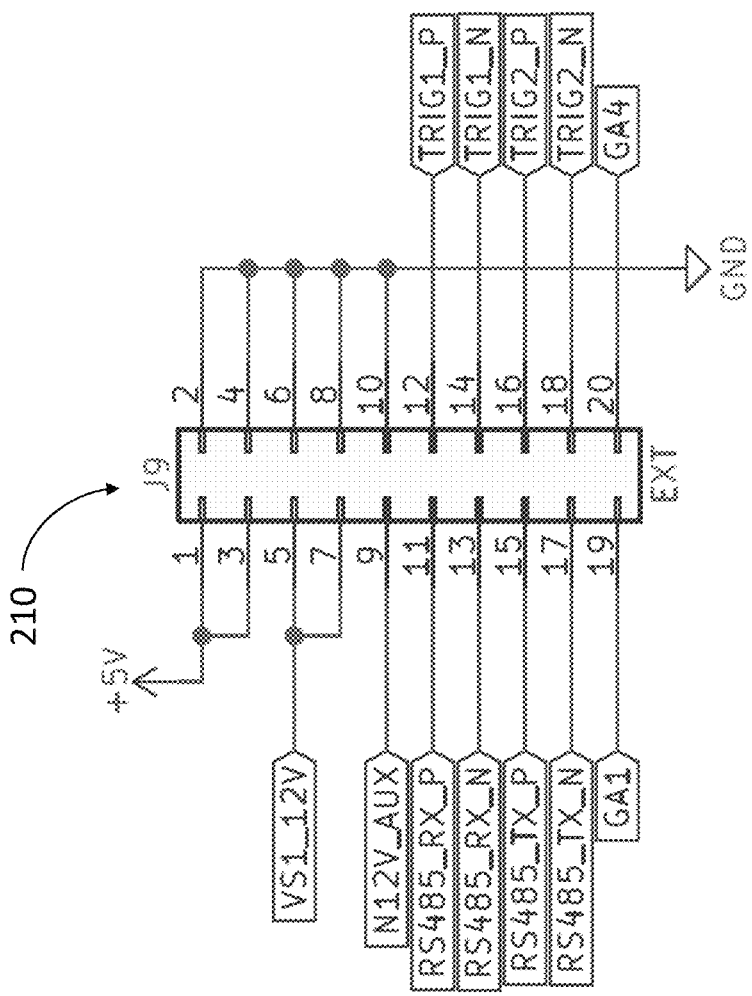
FIG. 6C is a circuit diagram showing the connections to a multi-pin remote interface according to one embodiment.
Figure 6D:
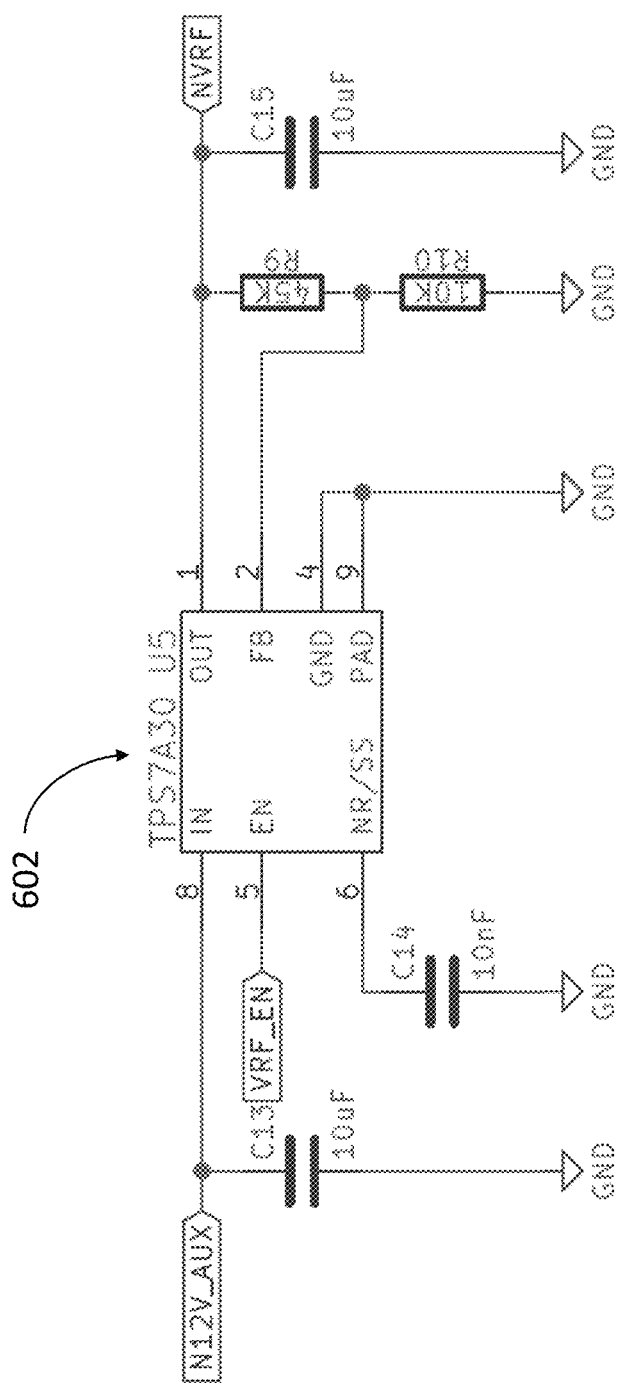
FIG. 6D is a circuit diagram showing the connections to a linear regulator 602 according to one embodiment.
Figure 6E:
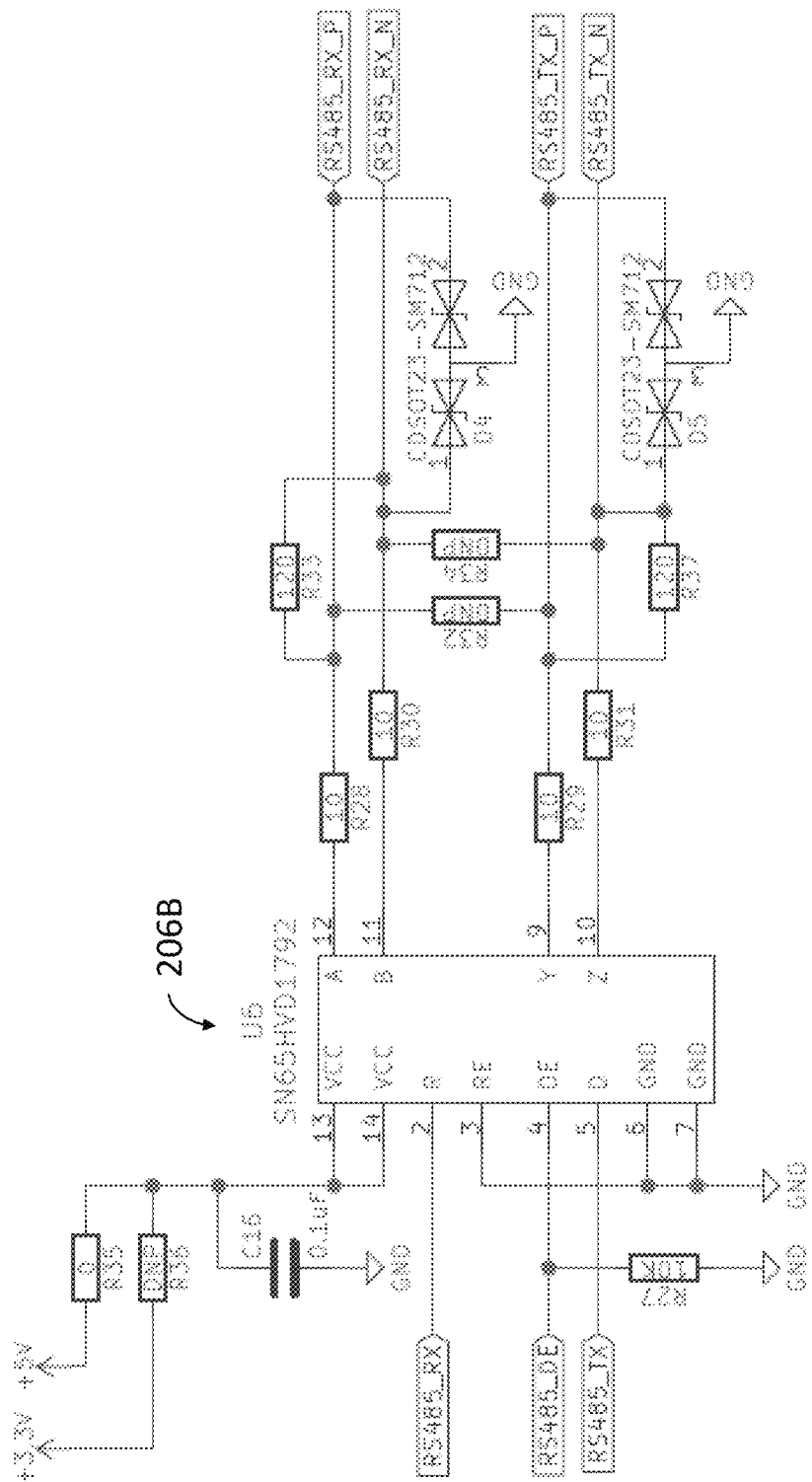
FIG. 6E is a circuit diagram showing the connections to an LVDS/RS-485 206 according to one embodiment.
Figure 6F:
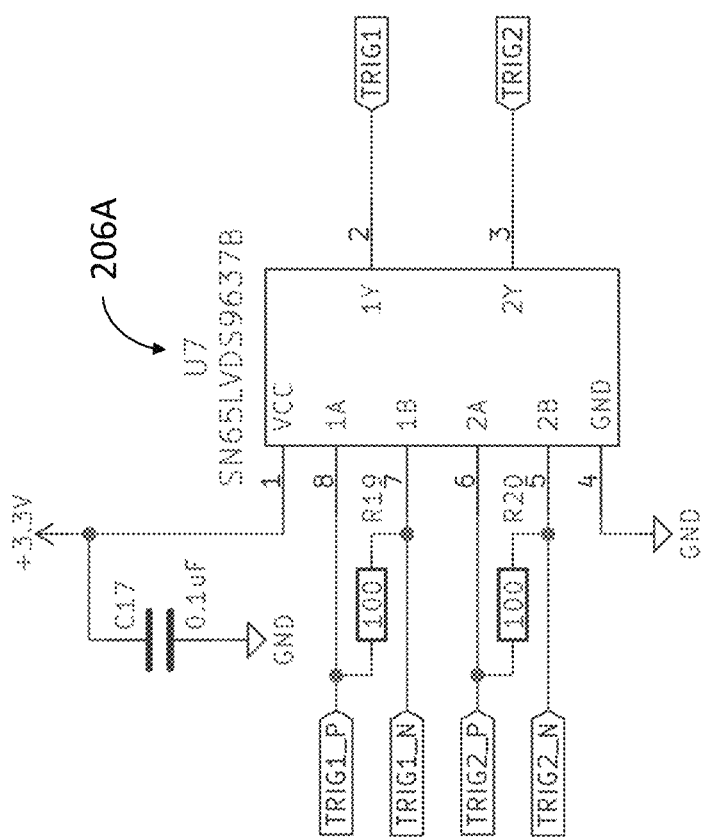
FIG. 6F is a circuit diagram showing the connections to an LVDS 206A according to one embodiment.

FIG. 6A illustrates the bottom left section 306 of FIG. 3A. Section 306 includes a power regulator 208, MPRI 210, a linear regulator 602, and an LVDS/RS-485 206A/206B. FIG. 6B is an electrical diagram showing the connections to power module 208. In the exemplary embodiment, power regulator 208 may be a TPSM84424 power module manufactured by Texas Instruments. FIG. 6C is an electrical diagram illustrating the connections to MPRI 210 in an exemplary embodiment. FIG. 6D is an electrical diagram showing the connections to linear regulator 328. In the exemplary embodiment, linear regulator 328 maybe a Texas Instruments TPS7A30 regulator. FIG. 6E is an electrical diagram showing the connections to RS-485 206B. FIG. 6F is an electrical diagram showing the connections to LVDS 206A. In an exemplary embodiment, where LVDS 206A is provided, an exemplary LVDS may be SN65LVDS180D manufactured by Texas Instruments. In an exemplary embodiment, where an RS-485 206B is provided, an exemplary RS-485 may be SN65HVD1792D manufactured by Texas Instruments. It should be noted that depending on whether an LVDS or an RS485 is implemented, the values of the resistors connected thereto change, as illustrated in Table 2 below (where DNP means "do not provide"):

TABLE 2

| 206 = LVDS (e.g., SN65LVDS1800 (150/400 Mbps) | 206 = SN65HVD1792D (1 Mbps) |
|---|---|
| R33 = 100 Ohms, R37 = DNP | R33, R37 = 120 Ohms |
| R28-R31 = 0 Ohms | R28-R31: 10 Ohms (pulse protection) |
| R35 = DNP, R36 = 0 Ohms (3.3 V) | R35 = 0 Ohms, R36 = DNP (5 V) |
| R32, R34 = DNP | R32, R34 = 0 Ohms Half Duplex, DNP Full Duplex |
| D4, D5 = DNP | D4, D5 = TVS (transient voltage suppression) > 70 V protection |

Having described the components of the bottom left section 306 of the first side 201, attention will now be directed the bottom center section 308.

Figure 7A:
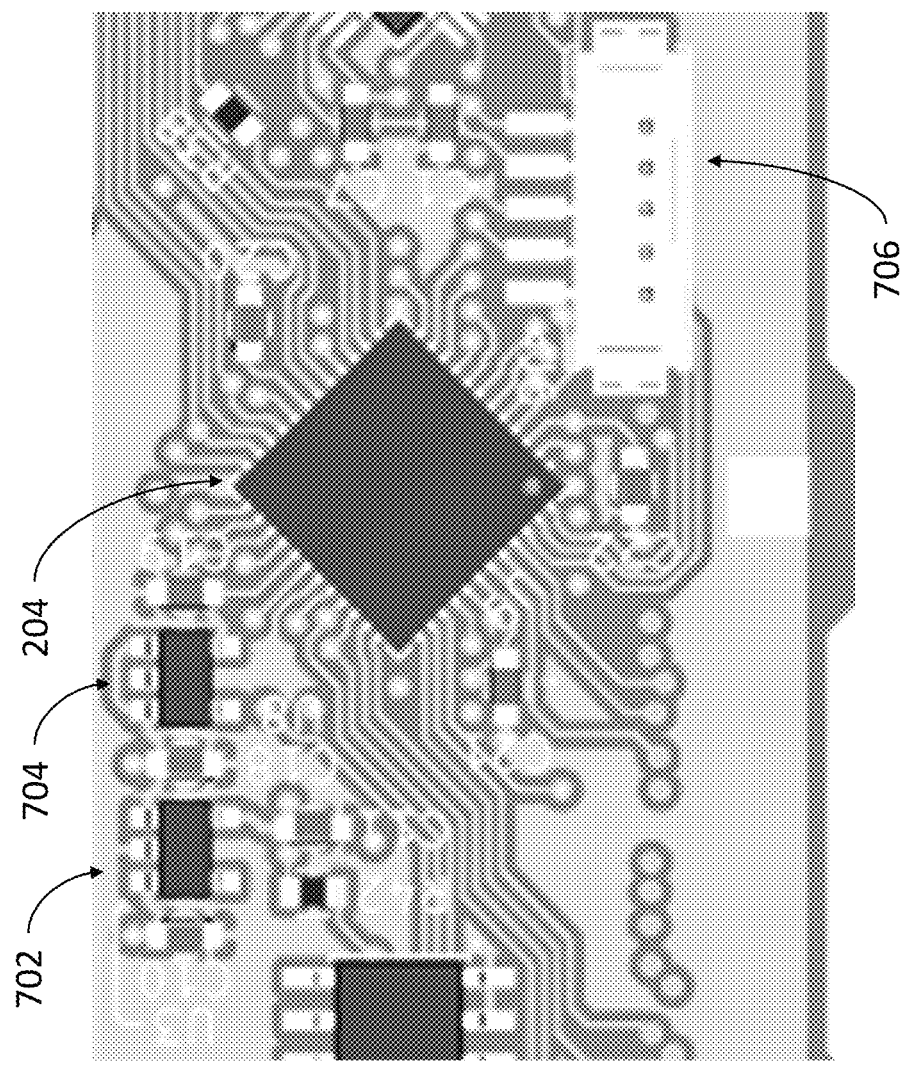
FIG. 7A is a plan view of section 308 of PCB 200 according to one embodiment.
Figure 7B:
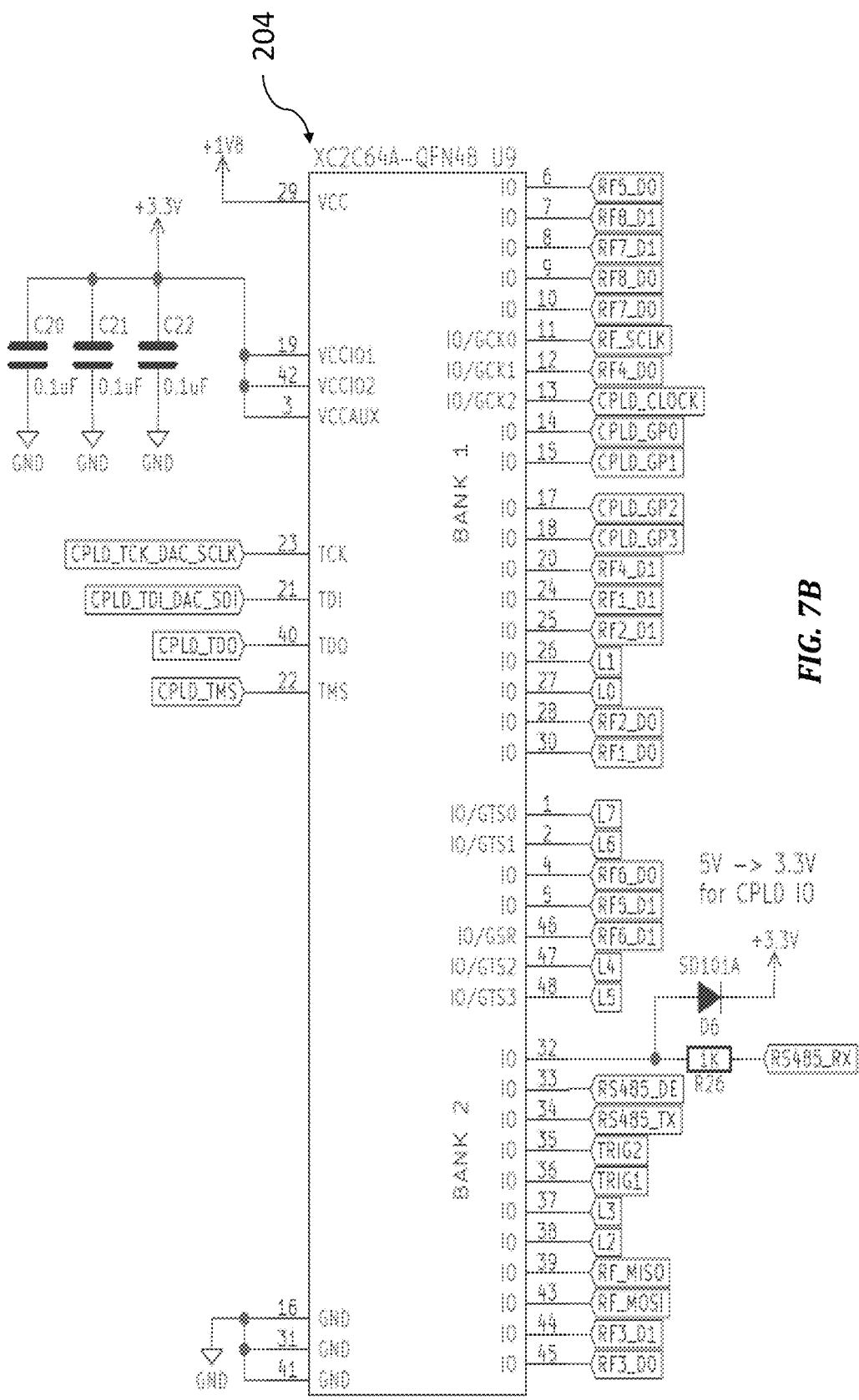
FIG. 7B is a circuit diagram showing the connections to a CPLD 204 according to one embodiment.
Figure 7D:
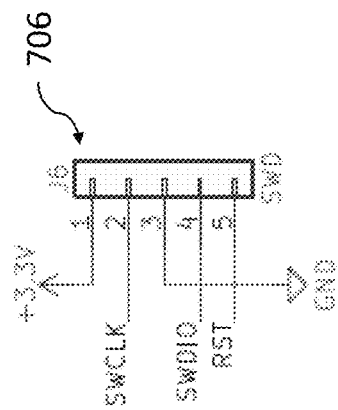
FIG. 7D is a circuit diagram showing the connections to switch 706 according to one embodiment.
Figure 7C:
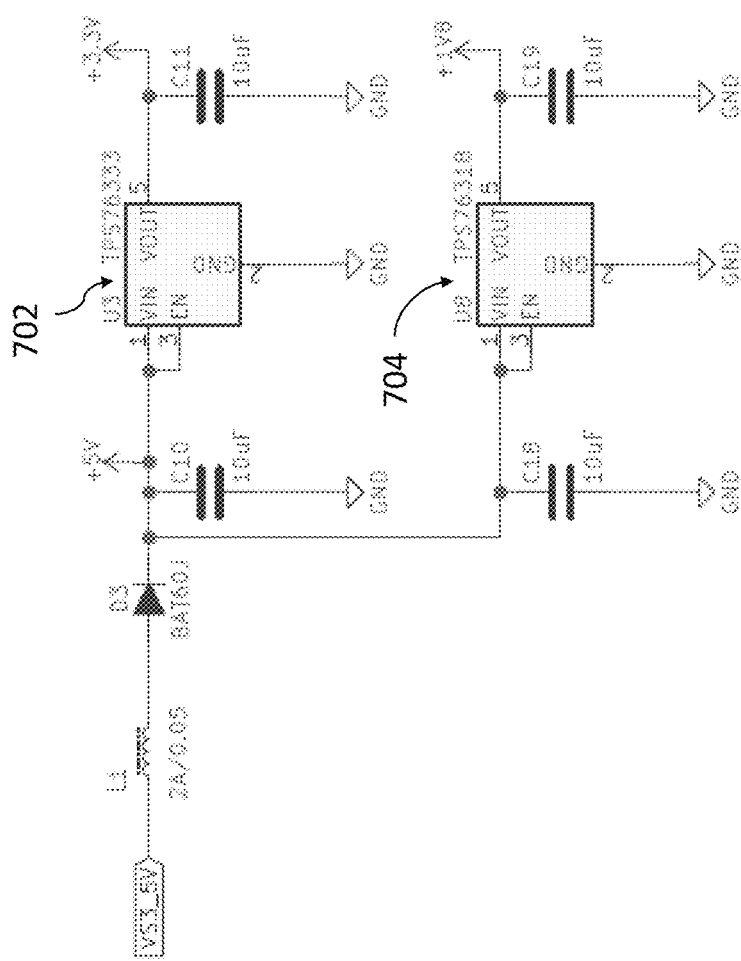
FIG. 7C is a circuit diagram showing the connections to a low dropout (LDO) voltage regulator 702 and a LDO linear regulator 704 according to one embodiment.

FIG. 7A is an enlarged view of the bottom center section 308 of the first side 201. The bottom center section 308 includes: CPLD 204, a low dropout (LDO) voltage regulator 702, a LDO linear regulator 704, and a switch 706. FIG. 7B illustrates the electrical connections to CPLD 204 according to an exemplary embodiment in which CPLD 204 is implemented by an XC2C664A-QFN48 made by Xilinx, Inc. FIG. 7C illustrates the electrical connections to LDO voltage regulator 702 and LDO linear regulator 704 which may be a TPS76333 and a TPS 76318, respectively, both of which are manufactured by Texas Instruments. Finally, FIG. 7D illustrates the electrical connections to switch 506. Having explained the components in the bottom center section 508 and provided exemplary circuit diagrams for the same, attention will now be directed to the bottom right section 310.

Figure 8A:
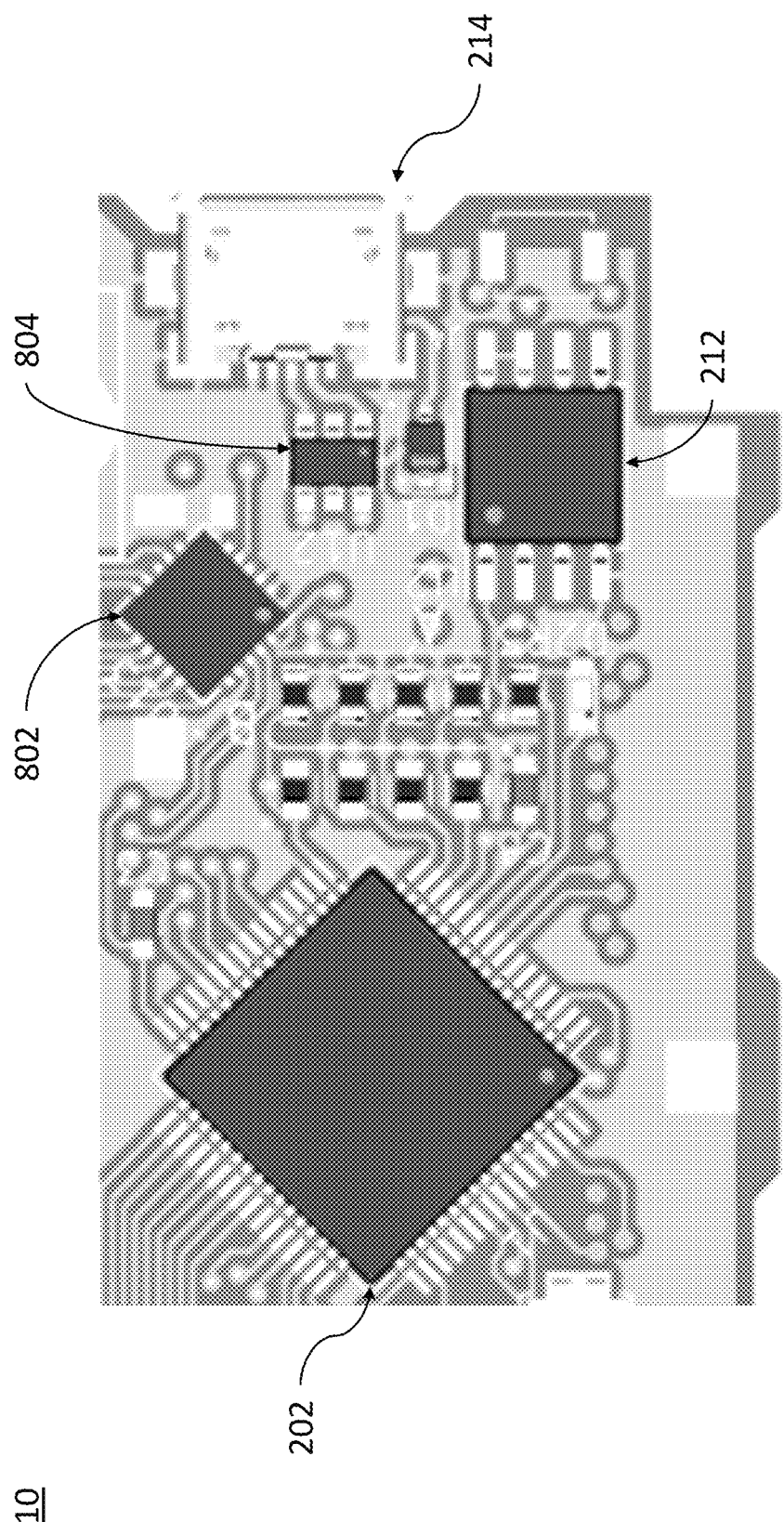
FIG. 8A is a plan view of section 310 of PCB 200 according to one embodiment.
Figure 8B:
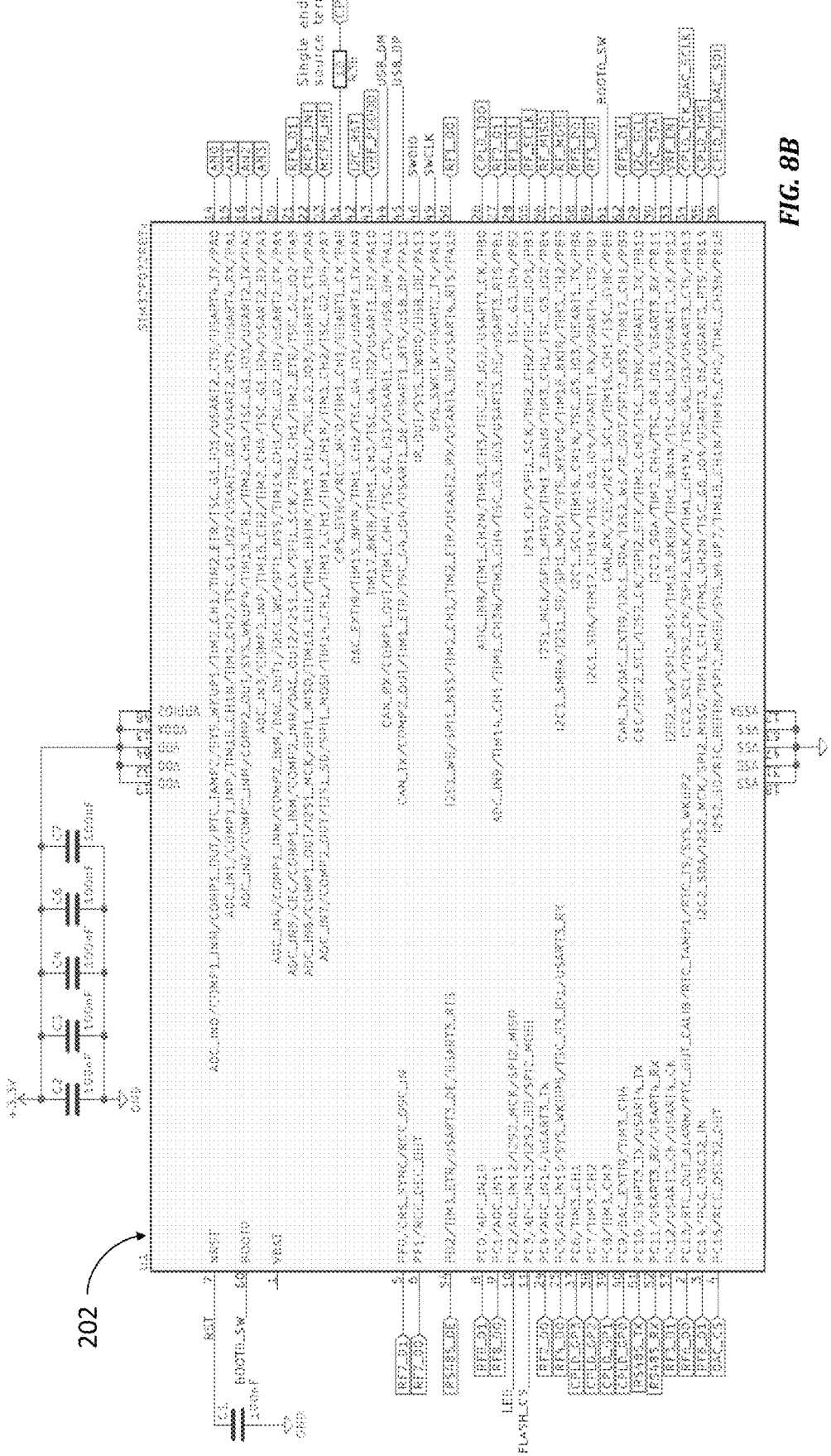
FIG. 8B is a circuit diagram showing the connections to controller 202 according to one embodiment.
Figure 8C:
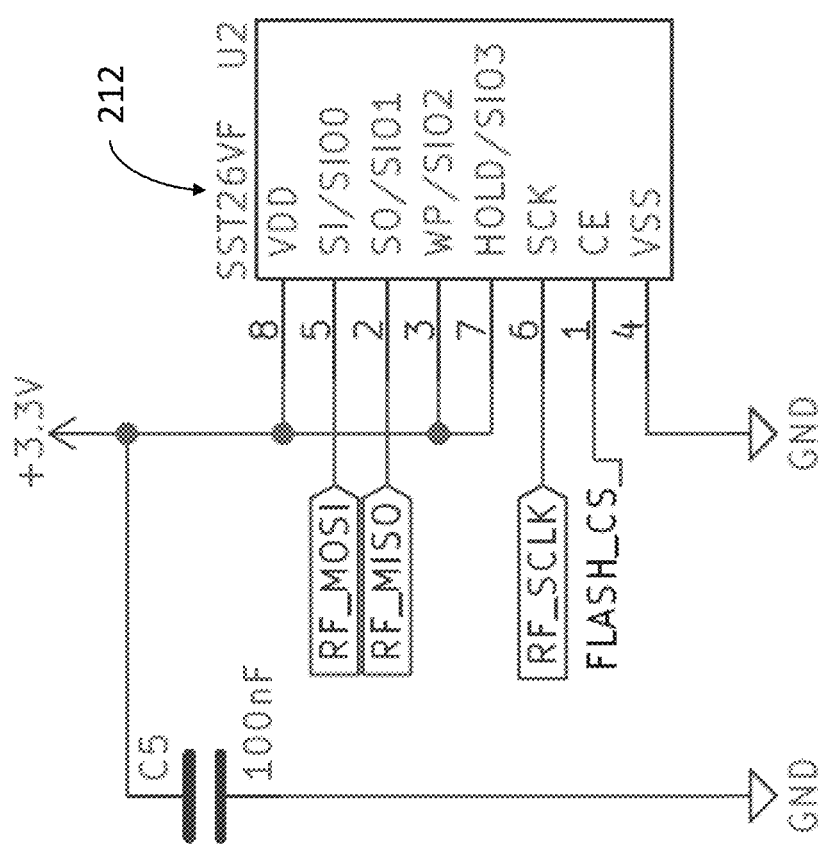
FIG. 8C is a circuit diagram showing the connections to memory 212 according to one embodiment.
Figure 8D:
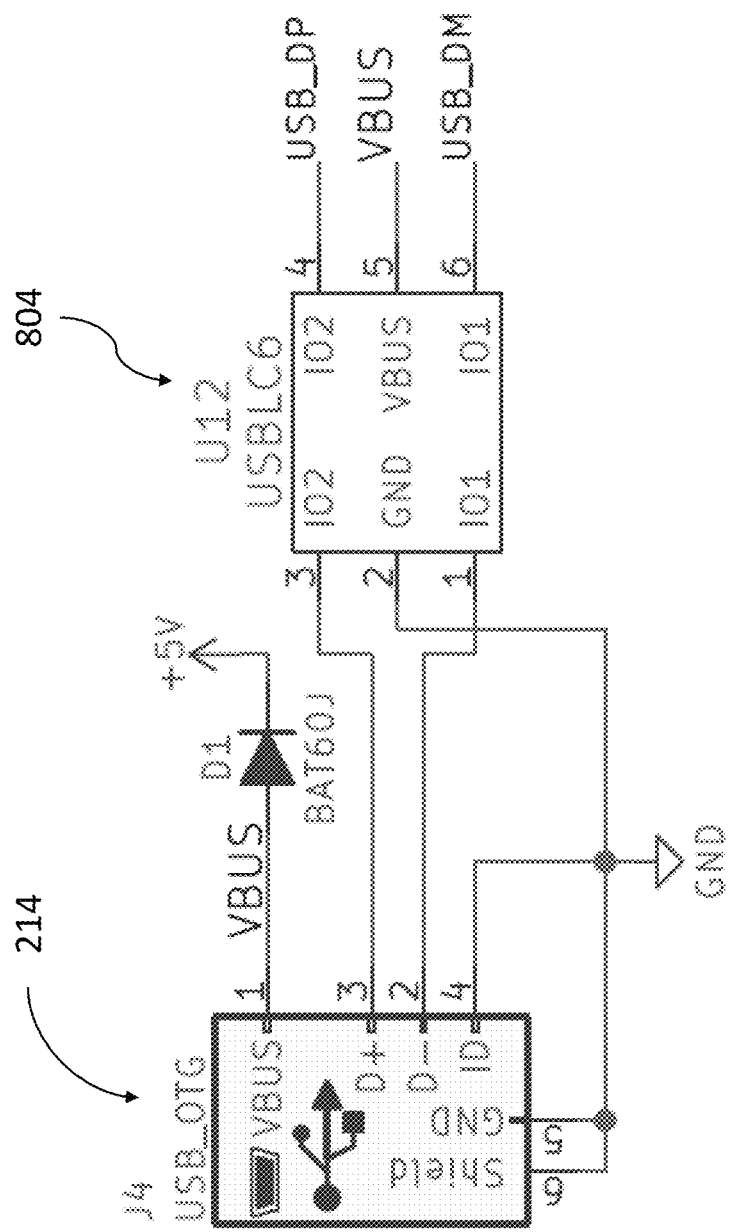
FIG. 8D is a circuit diagram showing the connections to USB interface 214 and ESD protector 804.
Figure 8E:
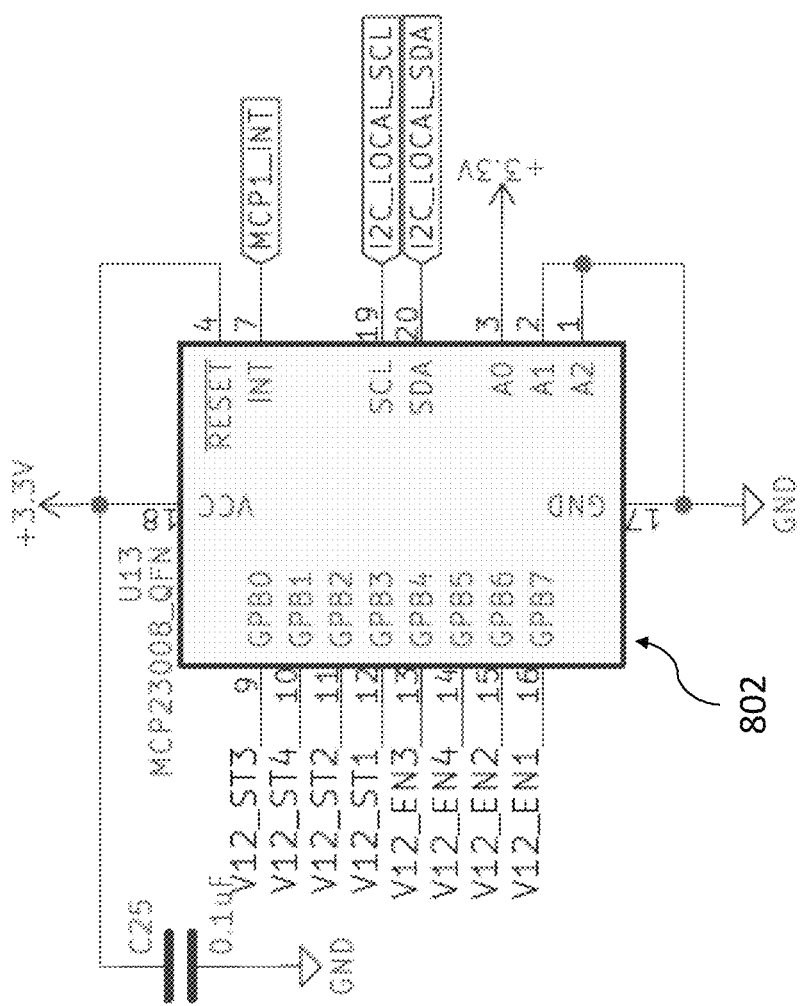
FIG. 8E is a circuit diagram showing the connections to I2C interface 802 according to one embodiment.

FIG. 8A is an enlarged plan view of the bottom right section 310 of the first side 201. Section 310 includes controller 202, memory 212, USB interface 214, I2C interface 802, and electrostatic discharge (ESD) protector 804. In an exemplary embodiment, controller 202 may be implemented as an ARM Cortex 32 bit RISC microcontroller, part no. STM32F072RBTx manufactured by STElectronics. FIG. 8B is a circuit diagram showing the connections to controller 202 when implemented by part no. STM32F072RBTx. Memory 212, in an exemplary embodiment, may be implemented as flash memory, e.g., 64 Mb Serial Quad I/O SQ1 Flash Memory (part no. SST2BVF064B manufactured by Microchip). FIG. 8C shows a circuit diagram corresponding to memory 212, when implemented by part no. SST2BVF064B. FIG. 8D shows a circuit diagram for USB 214 and ESD protector 804. ESD protector 804 may, in the exemplary embodiment, be implemented by part no. USBLC6 manufactured by STElectronics. Finally, FIG. 8E is a circuit diagram showing the connections to the I2C interface 802 when implemented by part no. MCP23008 manufactured by Microchip. Having described the components on the first side 201 of PCB 200 and illustrated their respective connections, attention will now directed to the second side 203.

Figure 9A:
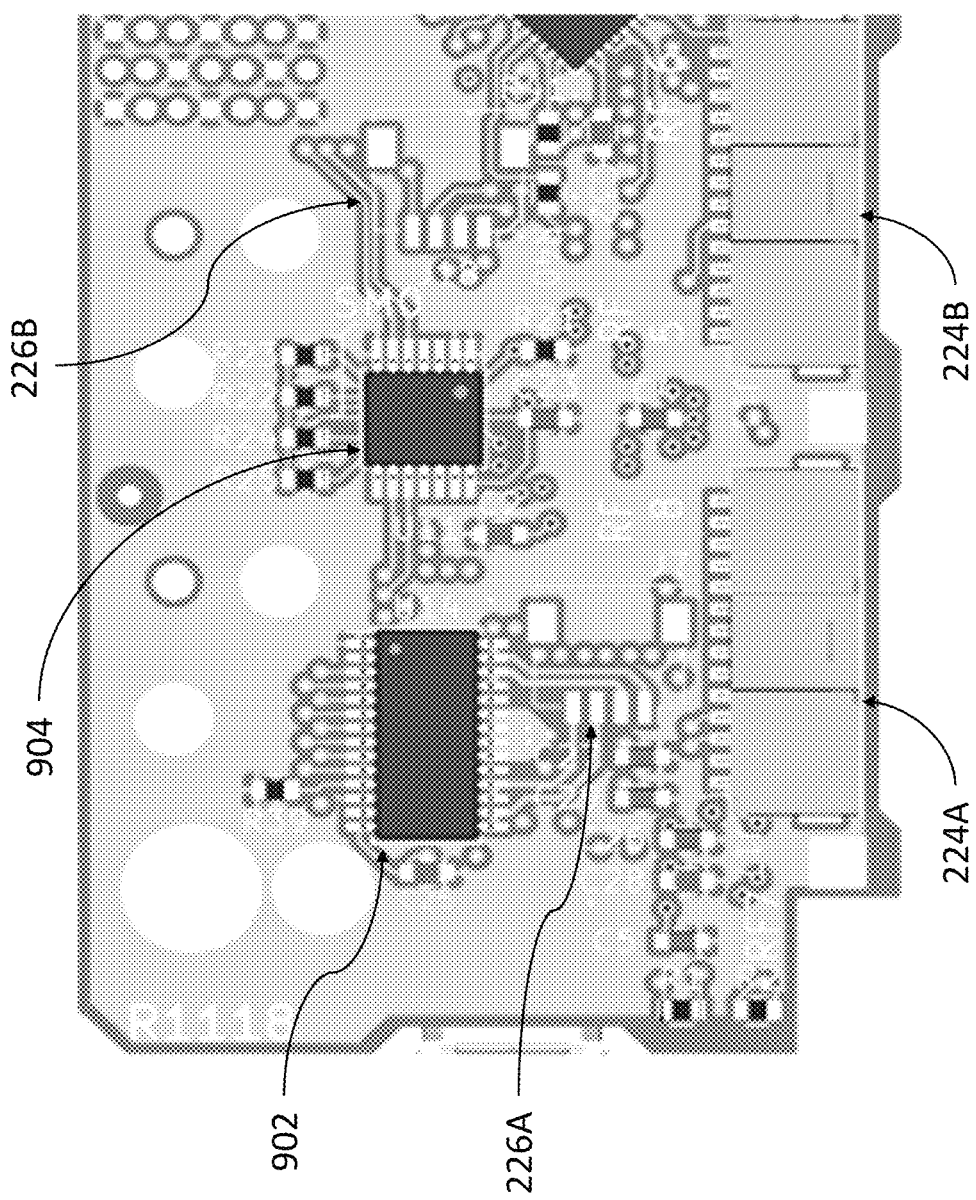
FIG. 9A is a plan view of section 312 of PCB according to one embodiment.
Figure 9B:
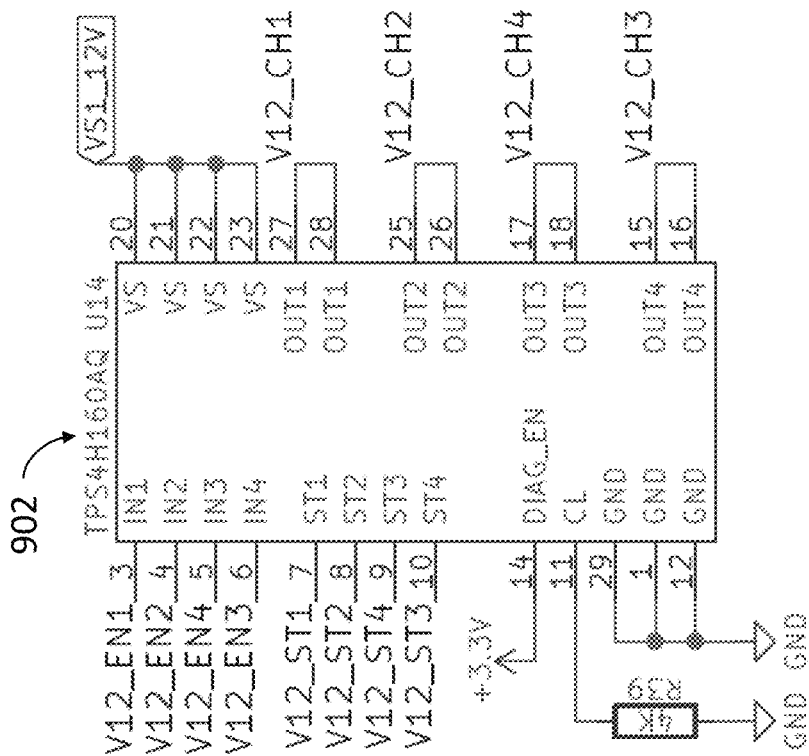
FIG. 9B is a circuit diagram illustrating the connections to switch 902 according to one embodiment.
Figure 9C:
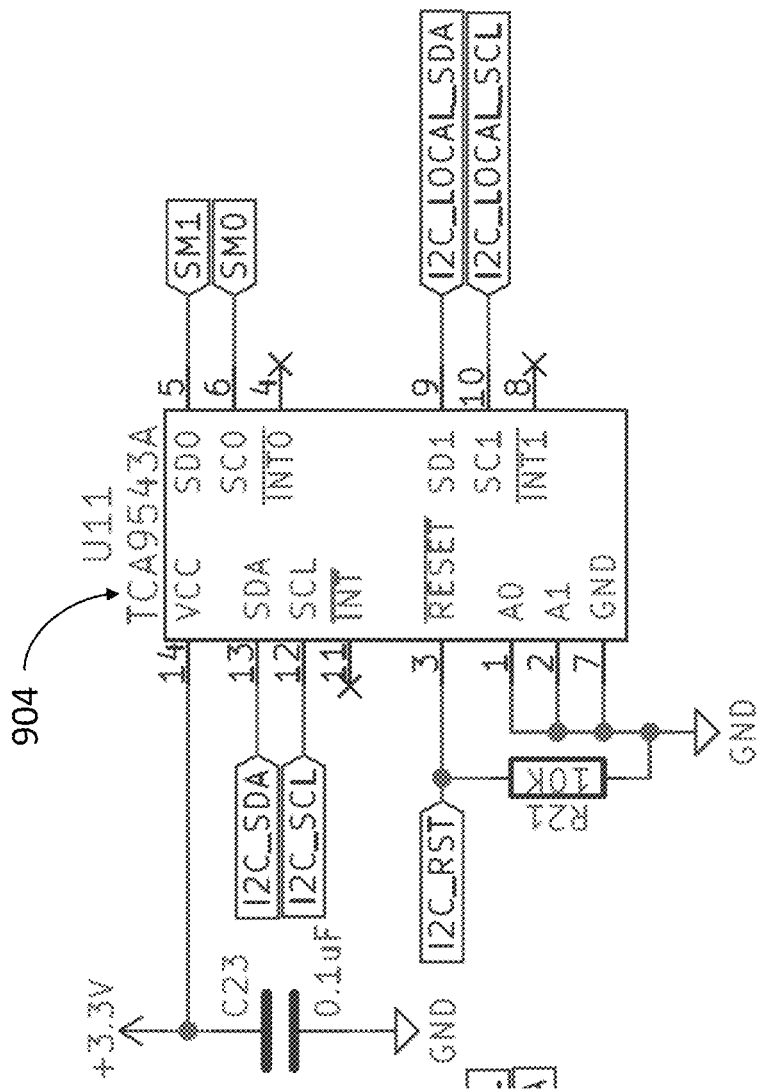
FIG. 9C is a circuit diagram illustrating the connections to I2C interface 904 according to one embodiment.
Figure 9E:
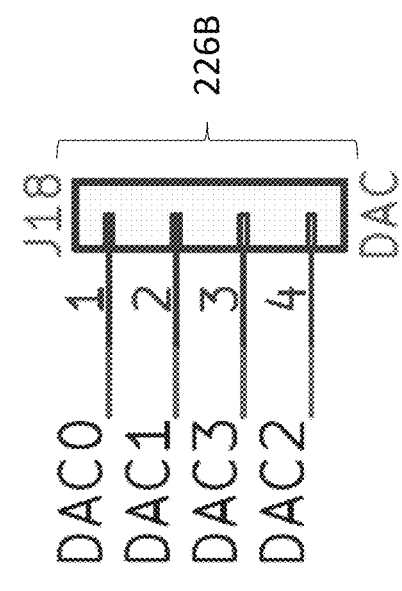
FIG. 9E is a pin diagram illustrating the pins for a power output 226B according to one embodiment.
Figure 9D:
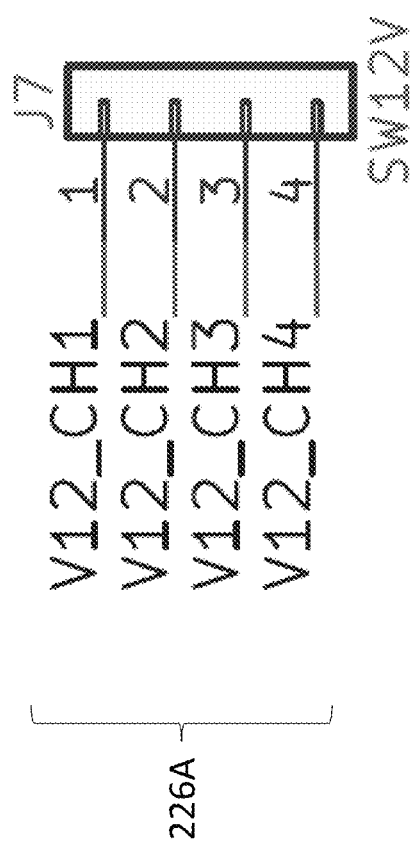
FIG. 9D is a pin diagram illustrating the pins for a power output 226A according to one embodiment.
Figure 9G:
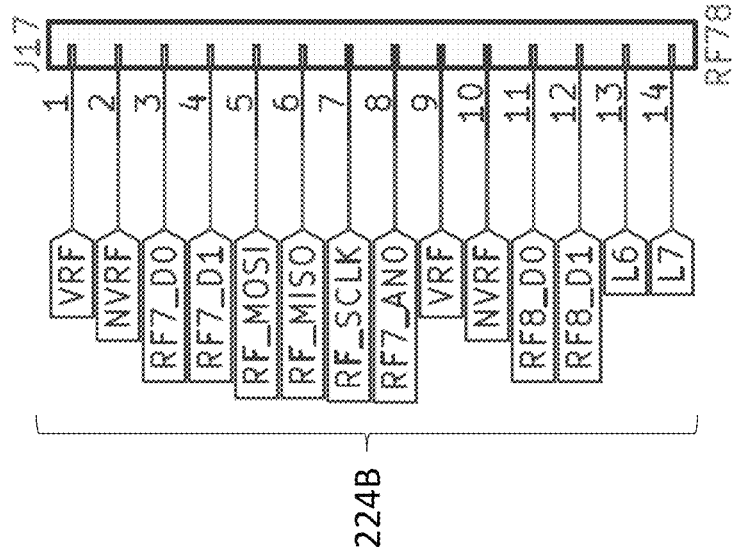
FIG. 9G is a pin diagram for connector 224B according to one embodiment.
Figure 9F:
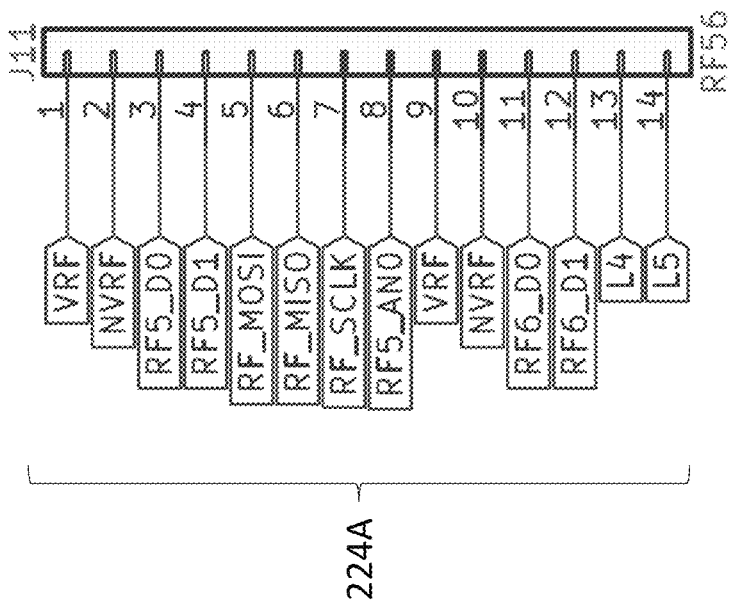
FIG. 9F is a pin diagram for connector 224A according to one embodiment.

FIG. 9A is a plan view of section 312 corresponding to the left section of second side 203 of PCB 200. Section 312 includes connectors 224A and 224B, power output 226A, DAC connection 226B, switch 902, and I2C interface 904. FIG. 9B is a circuit diagram illustrating the connections to switch 902, when switch 902 is implemented as a 160 mΩ Quad-Channel Smart High-Side Switch (part no. TPS4H160AQ manufactured by Texas Instruments). FIG. 9C is a circuit diagram illustrating the connections to I2C interface 904 when interface 904 is implemented as a low voltage 2-channel I2C (part no. TCA9543A manufactured by Texas Instruments). FIGS. 9D and 9E are circuit diagrams illustrating the connections to power output 226A and DAC connection 226B, respectively. FIGS. 9F and 9G are circuit diagrams illustrating the connections to connectors 224A and 224B, respectively. Having described section 312, attention will now be directed to the components in section 314.

Figure 10A:
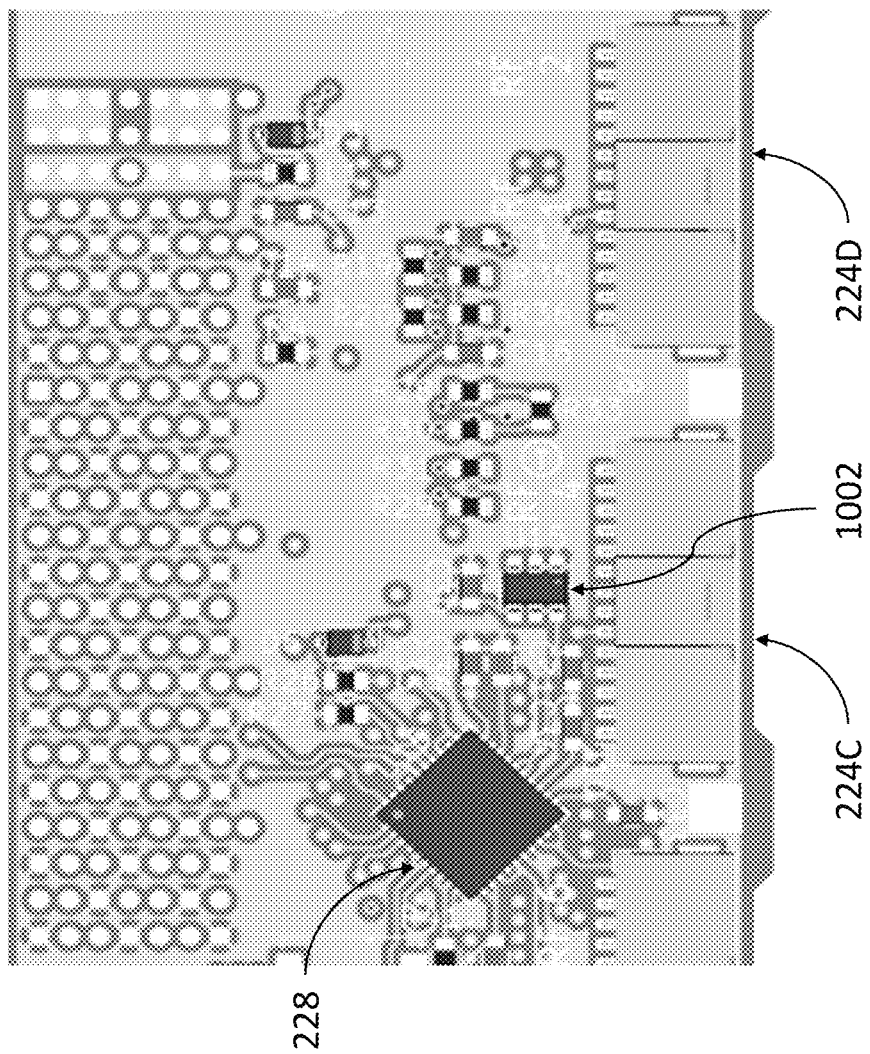
FIG. 10A is a plan view of section 314 of PCB 200 according to one embodiment.
Figure 10B:
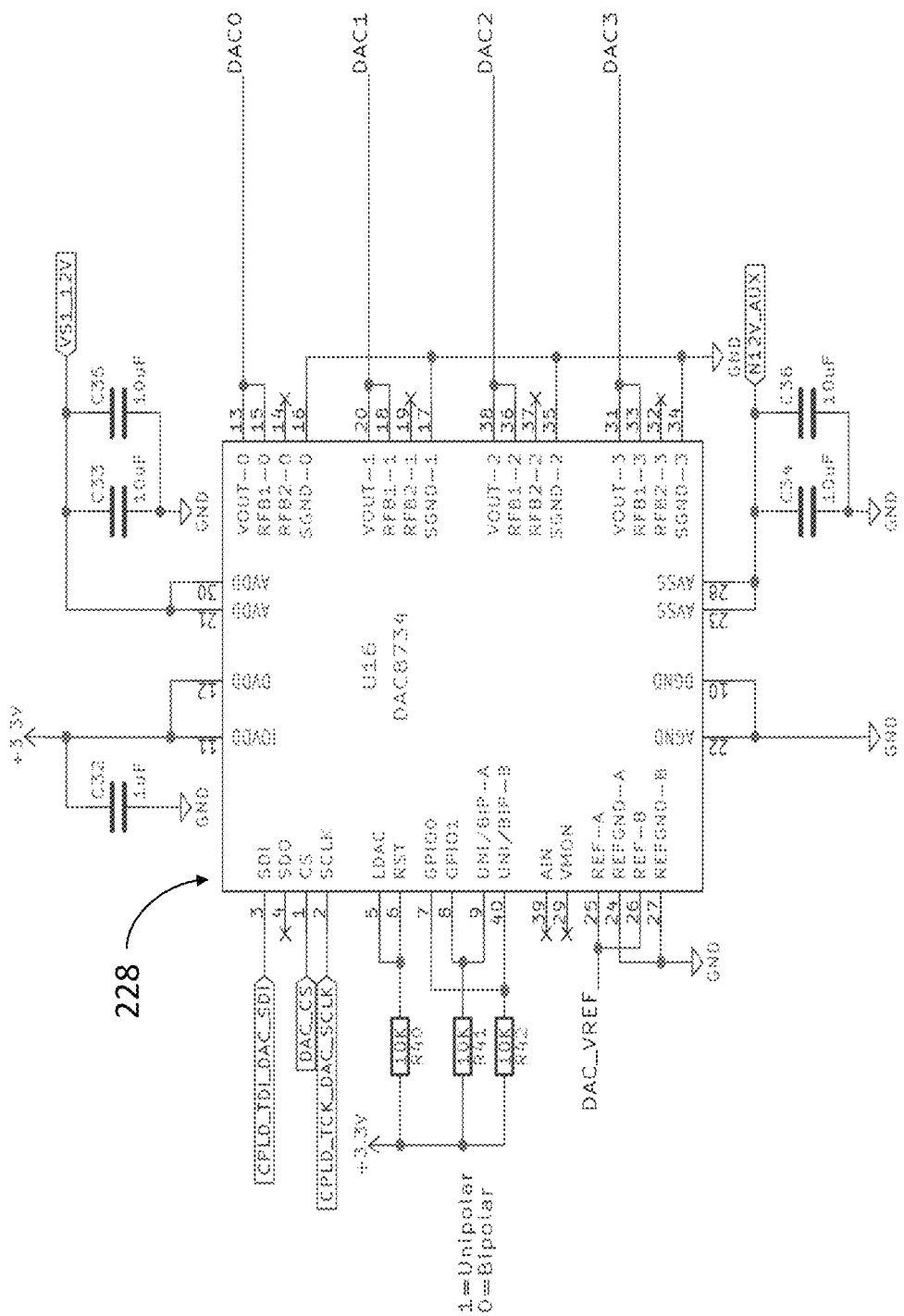
FIG. 10B is a circuit diagram illustrating the connections to digital-to-analog converter 228 according to one embodiment.
Figure 10C:
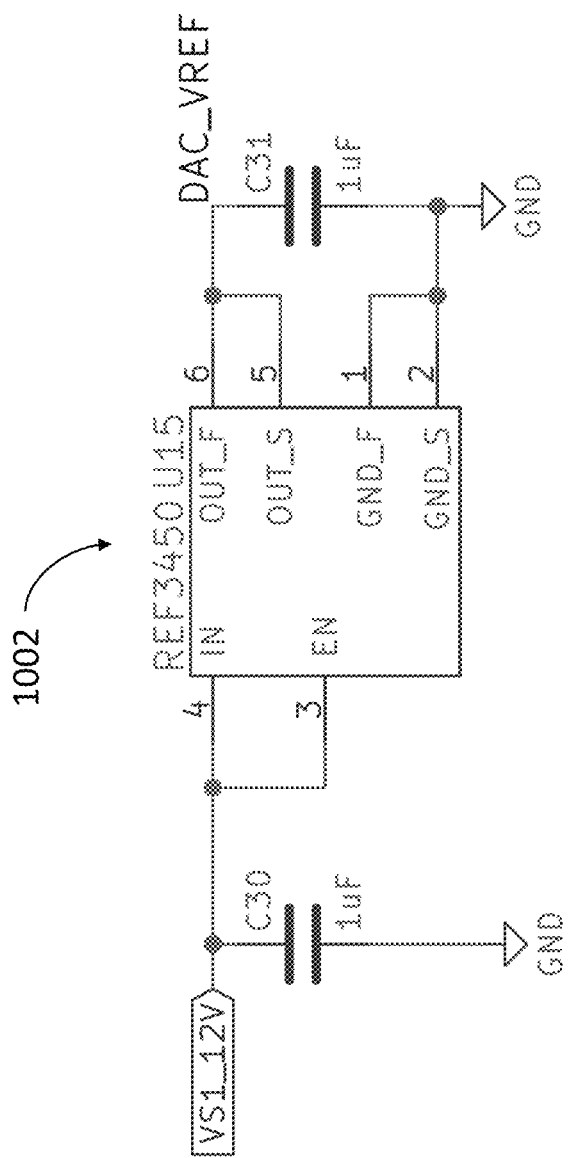
FIG. 10C is a circuit diagram illustrating the connections to a voltage reference 1002 according to one embodiment.
Figure 10E:
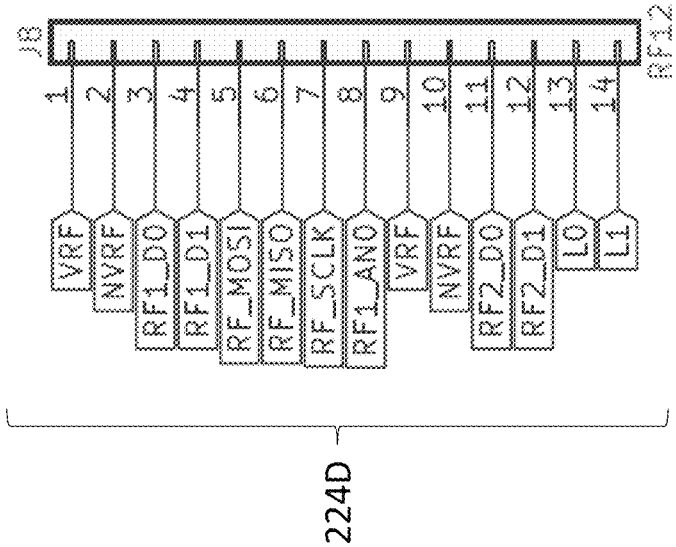
FIG. 10E is a pin diagram for connector 224D according to one embodiment.
Figure 10D:
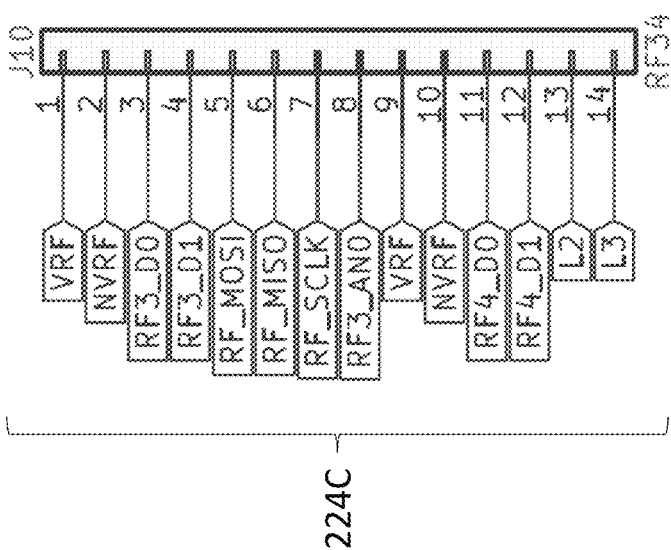
FIG. 10D is a pin diagram for connector 224C according to one embodiment.

FIG. 10A is a plan view of the center section 314 on the second side 203 of PCB 200. Section 314 includes a digital-to-analog (DA) converter 228, a voltage reference 1002, and connectors 224C and 224D. DA converter 228 may be, in an exemplary embodiment, a 16-Bit Quad High-Accuracy+/−16.5V Output Digital-to-Analog converter, such as DAC8734 manufactured by Texas Instruments. FIG. 10B is a circuit diagram showing the connections to DA converter 228 when implemented by a DAC8734. Voltage reference 1002 may be, in an exemplary embodiment, a 5V low-drift low-power voltage reference, such as REF3450 manufactured by Texas Instruments. FIGS. 10D-E are pin diagrams illustrating the connections to connectors 224C and 224D, respectively. Having described section 314, attention will now be directed to the components in section 316.

Figure 11A:
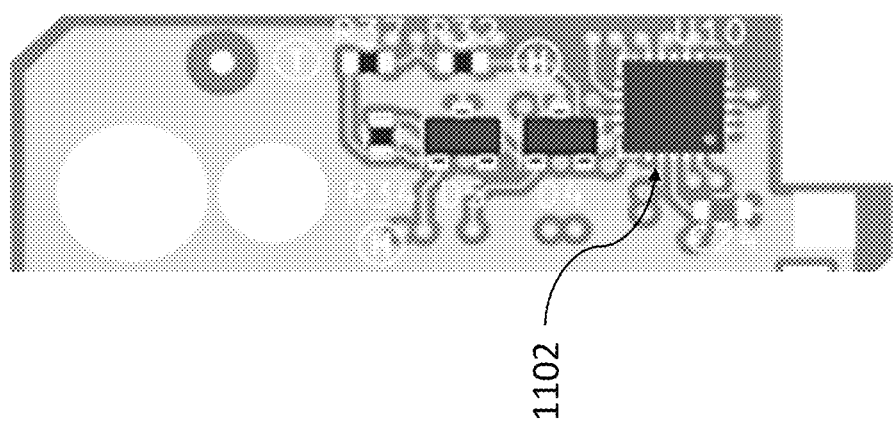
FIG. 11A is a plan view of section 316 of PCB 200 according to one embodiment.
Figure 11B:
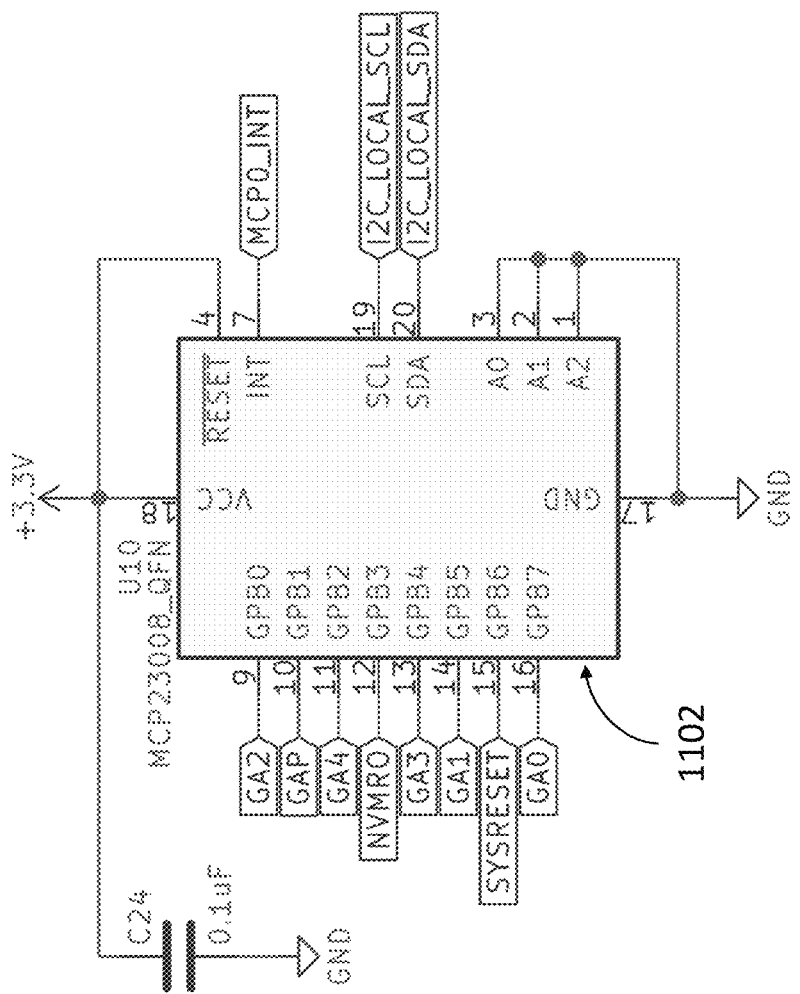
FIG. 11B is a circuit diagram illustrating the connections to I2C interface 1102 according to one embodiment.

FIG. 11A is a plan view of section 316 on the second side 203 of the PCB 200. Section 316 includes an I2C interface 1102 which, in an exemplary embodiment, may be a MCP23008 interface, like interface 802 described above, manufactured by Microchip. FIG. 11B is a circuit diagram showing the connections to interface 1102. Having described the components on PCB 200 and illustrated, via FIGS. 3A-11B, how those components are interconnected, attention will now be directed to the mechanical interface 205 between PCB 200 and subsystem 102.

Figure 12:
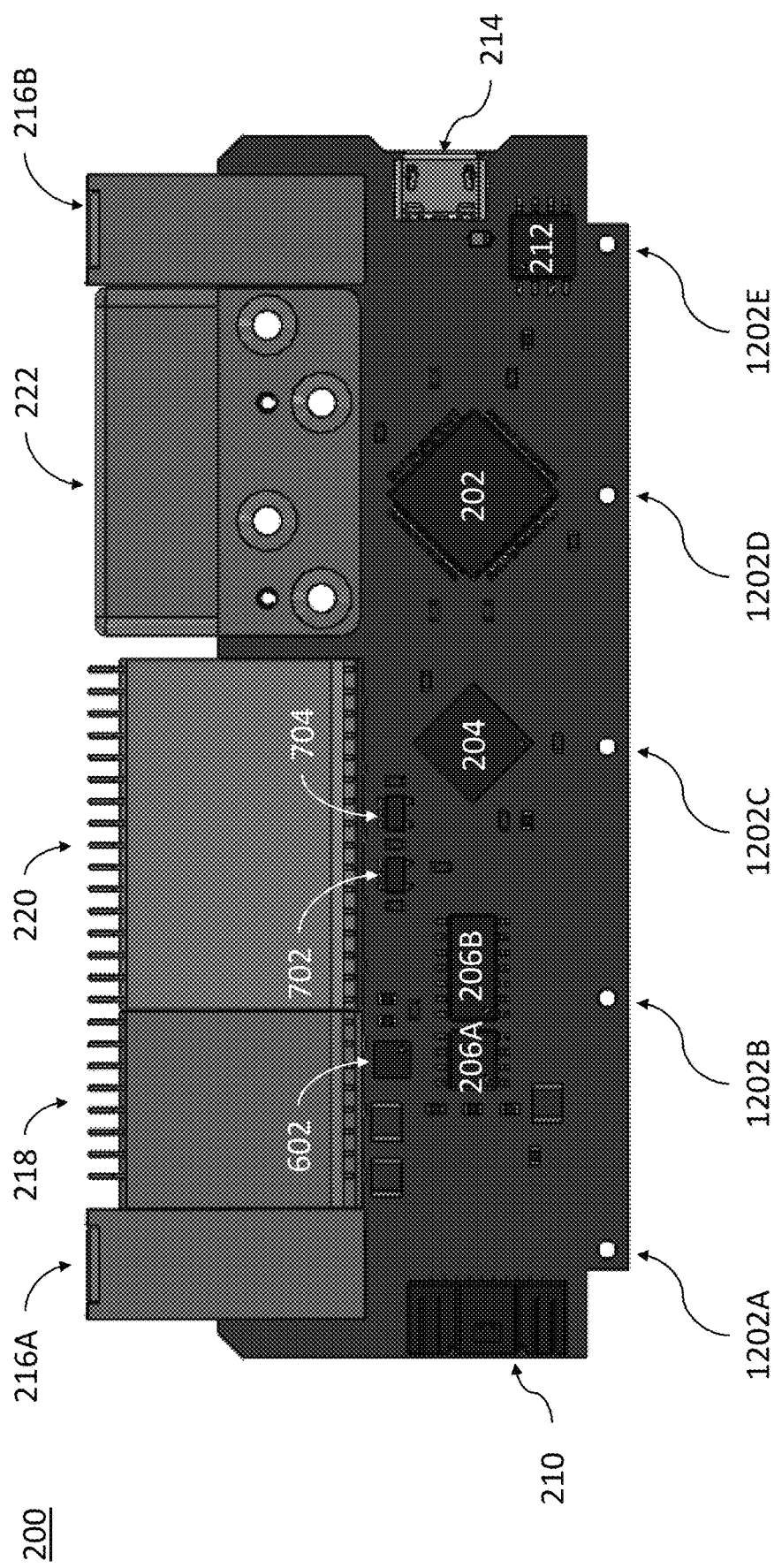
FIG. 12 is a plan view of PCB 200 according to one embodiment.

FIG. 12 is a plan view of PCB 200 that shows mounting holes 1202A-E that allow for a connection between PCB 200 and mechanical interface 205. While five mounting holes 1202A-E are shown in FIG. 12, that number is merely exemplary and could be two or more. Described below are three exemplary embodiments of mechanical interface 205, namely interfaces 1300, 1400, and 1500.

Figure 13A:
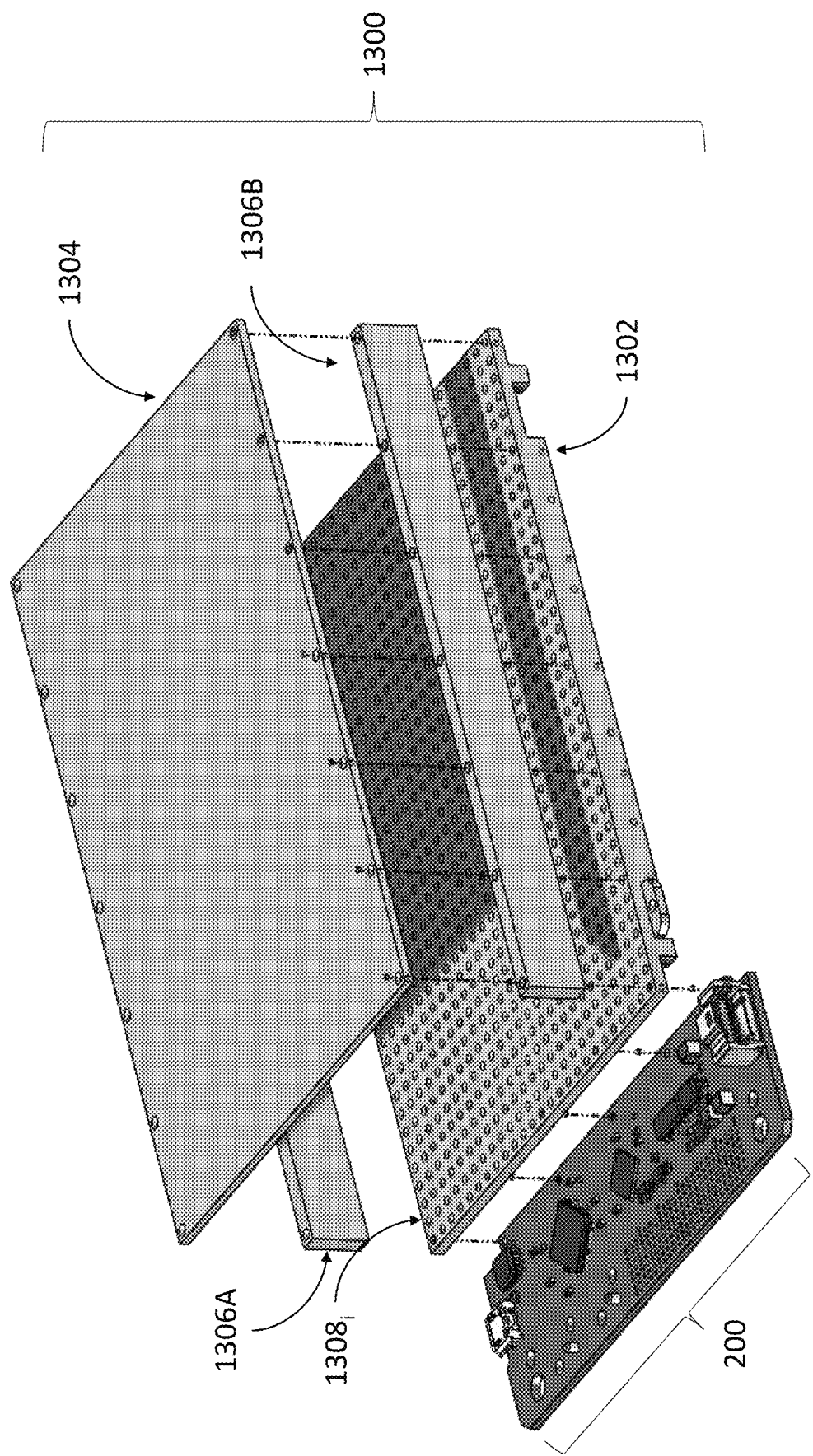
FIG. 13A is a perspective view of interface 104 showing a mechanical interface 1300 according to one embodiment.

FIG. 13A is an exploded perspective view of a mechanical interface 1300 for connecting PCB 200 with a subsystem 102. A gridded metal plate 1302 is provided and includes a plurality of threaded holes 1308$_i$ that allow for components of subsystem 102 to be fastened to the gridded metal plate 1302 using screws. Of course, as one of ordinary skill would appreciate, other types of fasteners could be used. For example, a pin connector type could be used where a pin is inserted through a hole in the component of subsystem 102 and a portion of the pin passes through hole $1308_i$ and then expands to make contact with a backside of plate 1302 thereby locking subsystem 102 to plate 1302. To remove subsystem 102, the expanded portion of the pin can be compressed such that the entirety of the pin fits within hole $1308_i$ thereby allowing the pin to be removed. Holes $1308_i$ may be aligned with holes 1202A-E and a fastener (e.g., a screw or pin connector) is then inserted into the holes $1308_i$ and 1202A-E to connect PCB 200 and plate 1302. This connection provides a mechanical pathway between PCB 200 and subsystem 102. Components of subsystem 102 may be connected to plate 1302 using holes $1308_i$ and a fastener and then electrically connected to components on PCB 200, as described below.

Figure 13B:
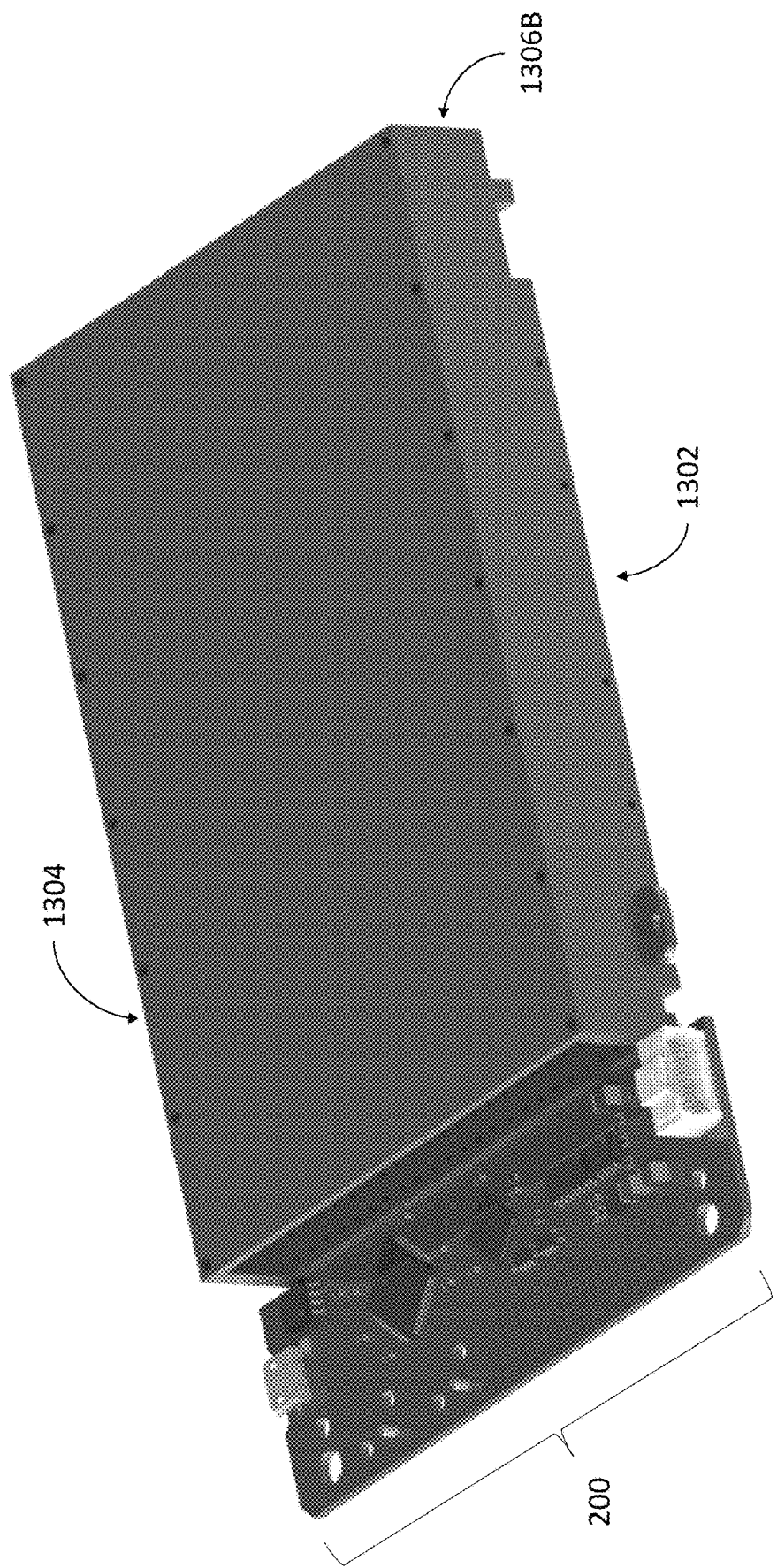
FIG. 13B is another perspective view of interface 104 showing a mechanical interface 1300 according to one embodiment.

However, in an exemplary embodiment, additional elements may be provided to enclose subsystem 102 to prevent damage thereto. For example, in one embodiment, side rails 1306A and 1306B may be provided with a height that is larger than the height of the components of subsystem 102 that are attached to plate 1302. A cover plate 1304 may then be provided to the side rails 1306A and 1306B through holes provided in both cover plate 1304 and sides rails 1306A and 1306B using an appropriate fastener (e.g., a screw). FIG. 13B shows an assembled enclosure formed by plate 1302, sides rails 1306A and 1306B, and cover plate 1304.

Figure 14:
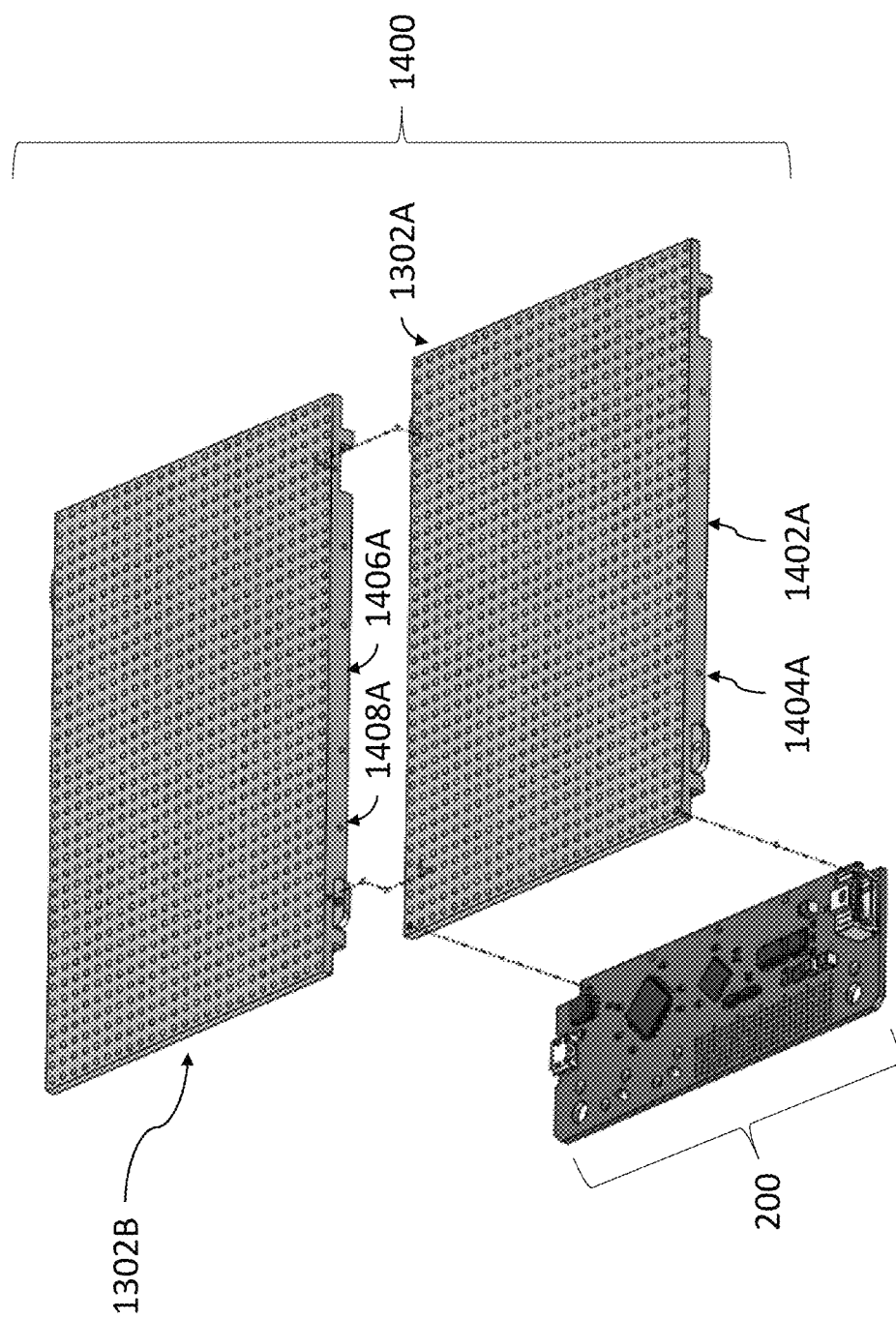
FIG. 14 is a perspective view of interface 104 showing a mechanical interface 1400 according to one embodiment.
Figure 15:
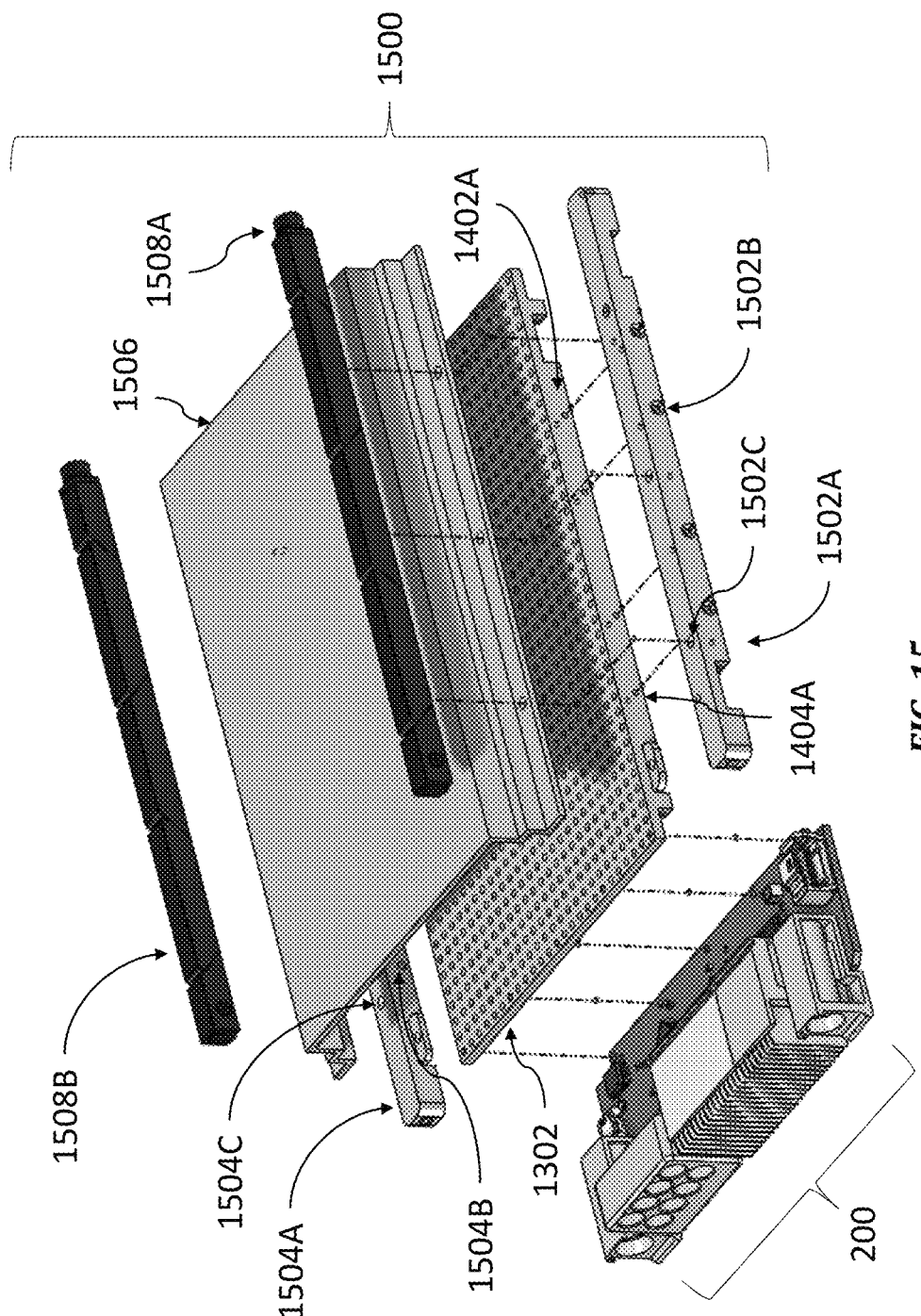
FIG. 15 is a perspective view of an interface 104 showing a mechanical interface 1500 according to one embodiment.

Of course, the configuration in FIG. 13B is merely exemplary and may be modified to accommodate the needs of subsystem 102. For example, if subsystem 102 includes a large number of components, such that all components cannot fit on a single plate 1302, then additional plates may be attached to plate 1302 to provide more space for the connections. FIG. 14 is illustrative.

FIG. 14 shows a mechanical interface 1400 that comprises a first connecting plate 1302A and a second connecting plate 1302B, each of which is identical to plate 1302 in FIG. 13. Plates 1302A and 1302B may be connected side-by-side. Plate 1302A includes a first flange 1402A and a second flange (not shown) disposed on a periphery of holes $1308_i$. The first flange 1402A on plate 1302A includes a plurality of holes 1404A that are approximately perpendicular to holes $1308_i$. The second flange (not shown) on plate 1302A also includes a plurality of holes (not shown) that are approximately perpendicular to holes $1308_i$. Similarly, plate 1302B includes a first flange 1406A and a second flange (not shown) disposed on a periphery of holes $1308_i$. The first flange 1406A on plate 1302B includes a plurality of holes 1408A that are approximately perpendicular to holes $1308_i$. The second flange (not shown) on plate 1302B also includes a plurality of holes (not shown) that are approximately perpendicular to holes $1308_i$. The holes in these flanges may be aligned and a connector inserted therein (e.g., a screw or a pin connection) that allows for plates 1302A and 1302B to be connected side-by-side.

In yet another embodiment, a mechanical interface 1500 may be provided that allows PCB 200 to be mounted, with subsystem 102, in a rack-mounted enclosure (not shown). Plate 1302 may have rail connectors 1502A and 1502B attached to the first flange 1402A and the second flange (not shown). Rail connectors 1502A and 1504A include a first plurality of holes 1502B and a second plurality of holes 1504B, respectively, that are aligned coaxially with holes 1404A on the first flange 1402A and holes (not shown) on the second flange (not shown). This arrangement allows the rail connectors 1502A and 1504A to be connected to the first flange 1402A and the second flange (not shown) respectively. Rail connectors 1502A and 1504A also include holes 1502C and 1504C that are substantially coaxial to holes $1308_i$ and allow the rail connectors 1502A and 1504A to connect to holes provided in a cover plate 1506 and in wedgelocks 1508A and 1508B which allow for conduction cooling to remove heat.

Figure 16:
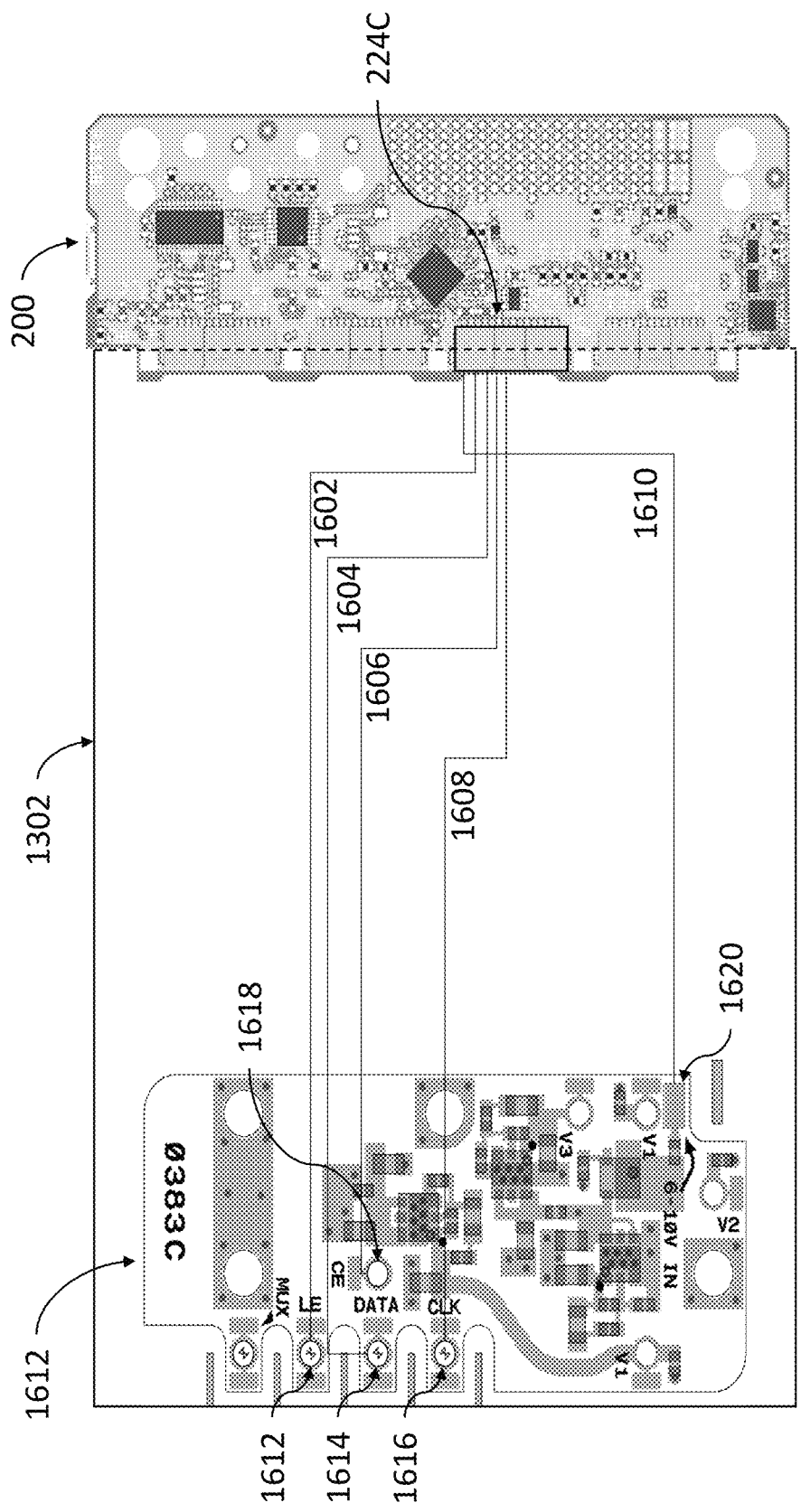
FIG. 16 is a schematic view illustrating the connections between a subsystem 102 and PCB 200 according to one embodiment.

Having described PCB 200 and the mechanical interfaces that may be used in conjunction with PCB 200, an exemplary operation of interface 104 will now be described in reference to FIG. 16. FIG. 16 shows a component 1612 of a microwave subsystem 102 connected to plate 1302 via holes $1308_i$ (which are omitted in FIG. 16 solely for the benefit of the illustration). PCB 200 is also connected to plate 1302 via holes 1202A-1202E (which are also omitted from FIG. 16 solely for the benefit of the illustration). In FIG. 16, component 1612 is an)(Microwave Voltage Regulator, part no. XM-A5R5-0409D, that outputs a specified voltage. However, as one of ordinary skill will recognize, this is merely exemplary and other components may be connected to plate 1302. Holes $1308_i$ on plate 1302 may be spaced to be compatible with)(Microwave components, and thus any component manufactured by)(Microwave may be connected to plate 1302 in accordance with a circuit designer's objective. Voltage regulator 1612 has a variety of connections. In the exemplary embodiment shown in FIG. 16, five connections are made between regulator 1612 and PCB 200 through connector 224C. Specifically, the load enable (LE) pin 1612, DATA pin 1614, clock (CLK) pin 1616, chip enable (CE) pin 1618, and voltage in (IN) pin 1620 are connected to PCB 200 through connector 224C. These connections are effectuated by soldering ends of wires 1602, 1604, 1606, 1608, and 1610 to pins 1612-1620, respectively, on regulator 1612 and connecting the other ends of wires 1602-1610 to a plug (not shown) that is compatible with and constructed to securely connect to connector 224C. Of course, as one of ordinary skill will appreciate, the use of connector 224C as opposed to connectors 224A, 224B, or 224D is arbitrary and regulator 1612 could easily be connected to another of connectors 224A, 224B, or 224D. FIG. 10D shows the details of connector 224C. For the embodiment shown in FIG. 16, Table 2 shows the connections between pins 1620-1620 and the pins of connector 224C.

TABLE 3

| Component 1612 Pins | Connector 224C Pins |
|---|---|
| 1612 - Latch Enable (LE) | 3 - RF3_D0 |
| 1614 - DATA | 5 - RF_MOSI |
| 1616 - Clock (CLK) | 7 - RF_SCLK |
| 1618 - Chip Enable (CE) | 4 - RF3_D1 |
| 1620 - Voltage In (IN) | 1 - VRF |

As discussed above, connector 224C is connected to controller 202 which in turn is connected to system 106 through one of more of the input-output devices on interface 104 (e.g., USB 214). This presents the opportunity for a variety of ways to control regulator 1612. For example, controller 202 may receive an instruction through USB 214 to set the output voltage for regulator 1612 at Vi. Controller 202, acting in concert with the control program stored in memory 212, may then cause pin 1 (VRF) of connector 224C to go high, thereby supplying power to through wire 1610 to voltage-in pin 1620. Wires 1602-1608, taken together, are a serial peripheral interface where a command to the LE pin 1612 is set to high or low, a command "word" (data) is sent over the MOSI pin (pin 5 of connector 224C) to the DATA pin 1614 through wire 1604, and the SCLK pin 1616 provides the time base, from pin 7 of connector 224C, for which subsystem 1612 registers the command. This command is then interpreted by the microwave component to control the microwave component accordingly (e.g., change frequency, set output power, enable output control, etc. . . . ).

Having described the components that may be provided on interface 104 and an exemplary operation thereof, attention will now be directed to exemplary steps for building interface 104, setting up interface 104 for operation with a connected subsystem 102, and connecting interface 104 and subsystem 102 to another system/device 106.

Figure 17:
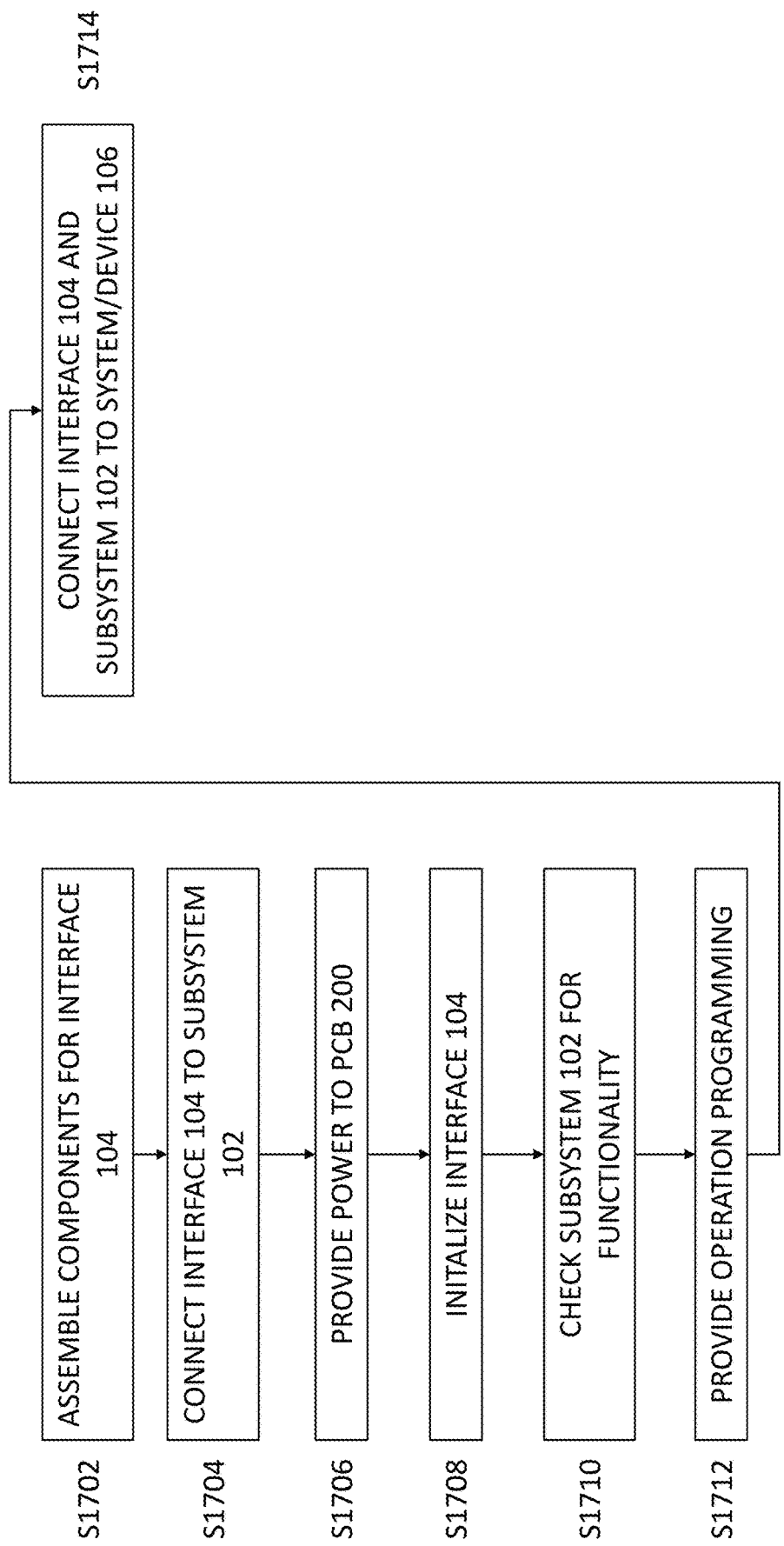
FIG. 17 is a flowchart illustrating a method of assembling, initializing, and operating interface 104.

FIG. 17 is a flowchart for creating interface 104 and bringing it into operation. First, in S1702, some or all of the components described above are attached to PCB 200. As discussed above, PCB 200 may be constructed to have a plurality of input/output components including some or all of the following: USB 214, LVDS 206A, RS-485 206B, MPRI 210, P0 connector 218, P1A connector 220A, the P1B connector 220B, and 3U VPX VITA 67.2 connector 222. However, not all of these components are required to operate interface 104. For example, if a VPX connection is not required for the overall system design, then connectors for the same may be omitted from PCB 200. In another example, LVDS 206A or RS-485 206B may be omitted in alternative embodiments. One of ordinary skill in the art will understand that a system designer will need to strike a balance between meeting system requirements and containing costs and will choose components for PCB 200 accordingly. However, in an exemplary embodiment, it is preferable to provide at least: USB 214 (to facilitate initialization of interface 104), MPRI 210, and one of LVDS 206A or RS-485 206B. If subsystem 102 includes XMicrowave components, then it is preferable to provide at least one of connectors 224A-D as well. Once the system designer has identified which components should be attached to PCB 200, the components themselves are attached via standard techniques (e.g., chip placement and soldering). At this time, other necessary components such as resistors, diodes, and capacitors are provide to PCB 200. Next, in S1704, the system designer decide what form of mechanical interface between subsystem 102 and interface 104 is most appropriate and provides the same.

Next, in S1706, power must be provided to the interface 104 and by extension subsystem 102. Interface 104 requires+12 V, +5 V, and −12V. The +5V power can be supplied by the USB alone; however, the other voltages must by supplied by some other means. In a non-VPX configuration, MPRI 210 may be configured to include pins for the +12V, +5V, and −12V voltages such that interface 204 may receive, through those pins, power from an external power supply. In a VPX configuration, P0 connector 218 includes contacts to receive+12V, +5V, and −12V power from an attached system (e.g., system 106). Having described the assembly of interface 104 and the supply of power thereto, attention will now be directed to the initialization of interface 104.

After interface 104 is assembled, it is generally necessary to initialize it (S1708) before use, especially if memory 212 is blank. Interface 104 may be connected to a device through USB 214 such that power and control programs may be provided to interface 104. More specifically, firmware for interface 104 may be transferred through USB 214. One preferred method for transmitting the firmware to interface 104 is to connect interface 104 to system 106 and provide the firmware to memory 212 via system 106 using a bootloader. As one of ordinary skill in the art will recognize, the firmware provides for basic operation of the interface 104 in accordance with the components installed on PCB 200, and includes code that allows for communication with system 106, or another device connected to, for example, USB 214 that is used to test the operation of interface 104. Through such a device, as one of ordinary skill will recognize, a user interface may be presented that allows for the user to talk to interface 104 (i.e., send and receive information and control signals). In a preferred embodiment, the user interface may be written in python, but other programming languages could also be used. Having described how interface 104 is initialized, attention will now be directed to communicating with interface 104 after initialization.

In S1710, interface 104 and subsystem 102 are checked for functionality. The user may initiate this process by launching the user interface on a connected device (e.g., system 106). The connected device will attempt to establish a connection to interface 104 through the connection pathway (e.g., USB 214), and provide an indicator on the user interface as to whether the connection was successful. Next, the connected device may attempt to establish control through the user interface. Control may be established by performing a simple task. For example, controller 202 may be instructed to write a byte to a specific location, toggle one of the input/output components on PCB 200, or turn power onto subsystem 102. In response to one of these tasks instructions, data may be received from subsystem 102 and/or interface 104 indicating how the same is being controlled in order to verify that the intended function is occurring. The extent to which the interface 104 and subsystem 102 are tested for functionality depends greatly upon the number of components on both the interface 104 and subsystem 102. The greater the number of components on subsystem 102, for example, the greater the need to test those components for functionality. While this manner of controlling interface 104 and subsystem 102 could, in theory, be extended beyond just checking functionality and used to operate subsystem 102 directly for its intended purpose that would require a degree of direct human interaction that may not be preferable. While this may be acceptable in a laboratory environment, if interface 104 and subsystem 102 are part a larger system, then such a degree of human oversight is likely unwanted. Thus, once functionality of interface 104 and subsystem 102 is established, it would be preferable to provide software that automates control of interface 104 (and by extension subsystem 102), as discussed below.

In S1712, software may be provided that controls the operation of interface 104 and subsystem 102 according to the intent of the system designer. For example, if interface 104 is being used for laboratory testing of a single component, then an automated script may be written using, for example, python to automate measurement of the microwave components on subsystem 102 with test equipment. If however, interface 104 and subsystem 102 are part of a larger system 106 for which the assembled payload of microwave components on subsystem 102 are merely part of the larger system's 106 overall design, then the system designer may generate a script that would capture various settings for the differently controlled microwave components (on subsystem 102) that are needed for those components to serve their functions in the overall system 106. For example, a "normal" operating state for one mode of interface 104/subsystem 102 may be that (i) an pin on MPRI 210 is set "high"; (ii) voltage regulator 702 is set "on", and (iii) a serial-peripheral interface connected microwave attenuator (part of subsystem 102) is set to a certain value. Another normal operating mode may be that (i) multiple pins of MPRI 210 are set differently; (ii) voltage regulator 702 is off, and (iii) the analog-to-digital converter (not shown) is sampling an analog signal received from subsystem 102. Once the settings for the various components are part of the script, that script can be tested using test equipment to ensure all of the components on subsystem 102 are operating as they are intended to be operated within system 106. If that test is successful, then interface 104 and subsystem 102 can be installed into system 106 via its mechanical interface. If however, subsystem 102 does not operate as intended in system 106 or a redesign is necessary, interface 104 and subsystem 102 can be easily detached from the mechanical interface for system 106 and modifications made to subsystem 102.

In fact, one of the benefits of the exemplary embodiment shown in FIG. 16, is that if the circuit designer wishes to exchange component 1612 for another component, all that is necessary is to disconnect wires 1602-1610 (which may be as simple as unplugging the plug to which they are connected) from connector 224C, remove component 1612 from plate 1302, attached the new component to plate 1302, and connects the wires from the new component to one or more of connectors 224A-224D. The new component can then be controlled by controller 202 in accordance with the control program stored in memory 212 and/or instructions received from system 106. Finally, in 51714, the interface 104 and subsystem 102 may be connected to the larger system 106 and control of the interface 104 and subsystem passed to the system 106.

Interface 104 described above presents several advantages. First, there is no need to design a new interface as components on subsystem 102 change, as is necessary with conventional approaches. Moreover, unlike other conventional systems such as the Raspberry Pi, interface 104 can supply power to a subsystem. Still further, because interface 104 is constructed to physically and electrically connect to a larger system, it allows for much easier design and implementation of larger systems that use RF/microwave subsystems.

While various example embodiments of the invention have been described above, it should be understood that they have been presented by way of example, and not limitation. It is apparent to persons skilled in the relevant art(s) that various changes in form and detail can be made therein. Thus, the disclosure should not be limited by any of the above described example embodiments, but should be defined only in accordance with the following claims and their equivalents.

In addition, it should be understood that the figures are presented for example purposes only. The architecture of the example embodiments presented herein is sufficiently flexible and configurable, such that it may be utilized and navigated in ways other than that shown in the accompanying figures.

Further, the purpose of the Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the example embodiments presented herein in any way. It is also to be understood that the procedures recited in the claims need not be performed in the order presented.

What is claimed is:

1. An apparatus for interfacing with a subsystem, comprising:
    a printed circuit board;
    a controller disposed on the printed circuit board;
    a complex programmable logic device disposed on the printed circuit board and communicatively connected to the controller, the complex programmable logic device comprising a plurality of reconfigurable logic gates and a plurality of registers;
    a connector disposed on the printed circuit board, the connector comprising a plurality of pins to exchange control signals and power signals,
        wherein the plurality of pins includes a plurality of reconfigurable interconnect pins, and
        wherein a first subset of the plurality of reconfigurable interconnect pins are connected to the complex programmable logic device and the controller, and
        wherein a second subset of the plurality of reconfigurable interconnect pins are connected to the complex programmable logic device;
    an RF/Microwave connector connected to the printed circuit board and constructed to send and receive radio frequency and microwave signals; and
    a mechanical interface constructed to provide a mechanical connection between the subsystem and the printed circuit board.

2. The apparatus of claim 1, further comprising:
    an interface communicatively connected to the controller and constructed to send and receive instructions and data from another system.

3. The apparatus of claim 2, wherein the interface is a USB interface.

4. The apparatus of claim 3, further comprising:
    a second interface communicatively connected to the controller and constructed to send and receive instructions and data.

5. The apparatus of claim 4, wherein the second interface is a multi-pin remote interface.

6. The apparatus of claim 5, wherein the multi-pin remote interface is communicatively connected to a low voltage differential signaling integrated circuit.

7. The apparatus of claim 6, wherein a portion of the low voltage differential signaling integrated circuit is communicatively connected to the complex programmable logic device.

8. The apparatus of claim 4, wherein the multi-pin remote interface is communicatively connected to a RS-485 integrated circuit.

9. The apparatus of claim 6, wherein the low voltage differential signaling integrated circuit is constructed to transmit a trigger signal directly to the complex programmable logic device, and the complex programmable logic device is configured to perform a firmware configurable function in response to the trigger signal.

10. The apparatus of claim 1, wherein the mechanical interface is a plate connected to the printed circuit board.

11. The apparatus of claim 10, further comprising:
    a subsystem component mechanically connected to the plate and electrically connected to the connector.

12. The apparatus of claim 11, wherein the subsystem component is mechanically fastened to the plate by a fastener connected to a hole of a plurality of holes in the plate.

13. The apparatus of claim 1, wherein the RF/Microwave connector is a 3U VPX connector comprising P0 connectors, P1A connectors, P1B connectors, and a 3U VPX VITA 67.2 connector, and is constructed to connect to a VPX compliant system.

\* \* \* \* \*